US011259422B2

(12) United States Patent
Stremersch et al.

(10) Patent No.: US 11,259,422 B2
(45) Date of Patent: Feb. 22, 2022

(54) CAPACITOR CARRIER ASSEMBLY WITH HOUSING HAVING ENCAPSULATION FEATURES

(71) Applicant: Robert Bosch GmbH, Stuttgart (DE)

(72) Inventors: Daniel Stremersch, Stuttgart (DE); Ligor Manushi, Northville, MI (US); Kenneth Bouman, Livonia, MI (US); Hadwan Hadwan, Detroit, MI (US); John Janson, Plymouth, MI (US); Andrew Yermak, Farmington Hills, MI (US); Alexander Tsang, Ann Arbor, MI (US); Mark Ryskamp, Grosse Pointe Park, MI (US); Jesus Antonio Marin Bello, Guadalajara (MX); Jeff Reuter, Farmington, MI (US)

(73) Assignees: Robert Bosch LLC, Broadview, IL (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/829,342

(22) Filed: Mar. 25, 2020

(65) Prior Publication Data
US 2021/0304970 A1 Sep. 30, 2021

(51) Int. Cl.
*H05K 5/00* (2006.01)
*H01G 9/008* (2006.01)
*H01G 9/08* (2006.01)

(52) U.S. Cl.
CPC ............ *H05K 5/0091* (2013.01); *H01G 9/008* (2013.01); *H01G 9/08* (2013.01)

(58) Field of Classification Search
CPC ............ H01G 9/008; H01G 9/08; H01G 9/10; H01G 2/106; H05K 2201/10015; H05K 7/142; H05K 5/0091; G06F 1/184
See application file for complete search history.

(56) References Cited

U.S. PATENT DOCUMENTS

| | | | |
|---|---|---|---|
| 4,126,369 A | 11/1978 | Rapata et al. |
| 4,255,779 A | 3/1981 | Meal |
| 4,447,105 A | 5/1984 | Ruehl |
| 6,057,615 A | 5/2000 | Long |
| 6,233,155 B1 | 5/2001 | Moster et al. |
| 6,300,564 B1 | 10/2001 | Moraes et al. |
| 6,612,880 B2 | 9/2003 | Arnett et al. |
| 6,717,797 B1 | 4/2004 | Martin et al. |
| 6,790,071 B2 | 9/2004 | Uezono |
| 7,026,910 B2 | 4/2006 | Apel |
| 7,736,173 B2 | 6/2010 | Chen |
| 7,791,901 B2 | 9/2010 | Sailor et al. |
| 8,206,178 B2 | 6/2012 | Hinteresch et al. |
| 8,251,710 B2 | 8/2012 | Chen |

(Continued)

*Primary Examiner* — James Wu
(74) *Attorney, Agent, or Firm* — Kelly McGlashen

(57) ABSTRACT

A capacitor carrier assembly includes a carrier, a capacitor disposed in the carrier and electrically conductive connection terminals that support the carrier with respect to another electronic component or device such as a printed circuit board. Each connection terminal has a body portion that is electrically connected to one capacitor lead of the pair of capacitor leads at a connection location, and a device connection portion that protrudes from the carrier. Leads of the capacitor and the connection locations are encapsulated by wall structures of the carrier.

20 Claims, 14 Drawing Sheets

(56) References Cited

U.S. PATENT DOCUMENTS

| | | | |
|---|---|---|---|
| 8,553,429 B2 * | 10/2013 | McNamara | H05K 7/12 |
| | | | 361/810 |
| 8,627,564 B2 | 1/2014 | Blossfeld et al. | |
| 9,601,282 B2 | 3/2017 | Isonga | |
| 9,685,276 B2 | 6/2017 | Jarvelainen | |
| 10,257,947 B2 | 4/2019 | Hugaud et al. | |
| 2006/0076384 A1 | 4/2006 | Dickie | |
| 2010/0267252 A1 | 10/2010 | Fujimoto | |
| 2012/0238140 A1 * | 9/2012 | Hamaoka | H01R 13/6625 |
| | | | 439/620.24 |
| 2017/0339792 A1 | 11/2017 | Hattori et al. | |
| 2020/0118762 A1 | 4/2020 | Takeoka et al. | |

* cited by examiner

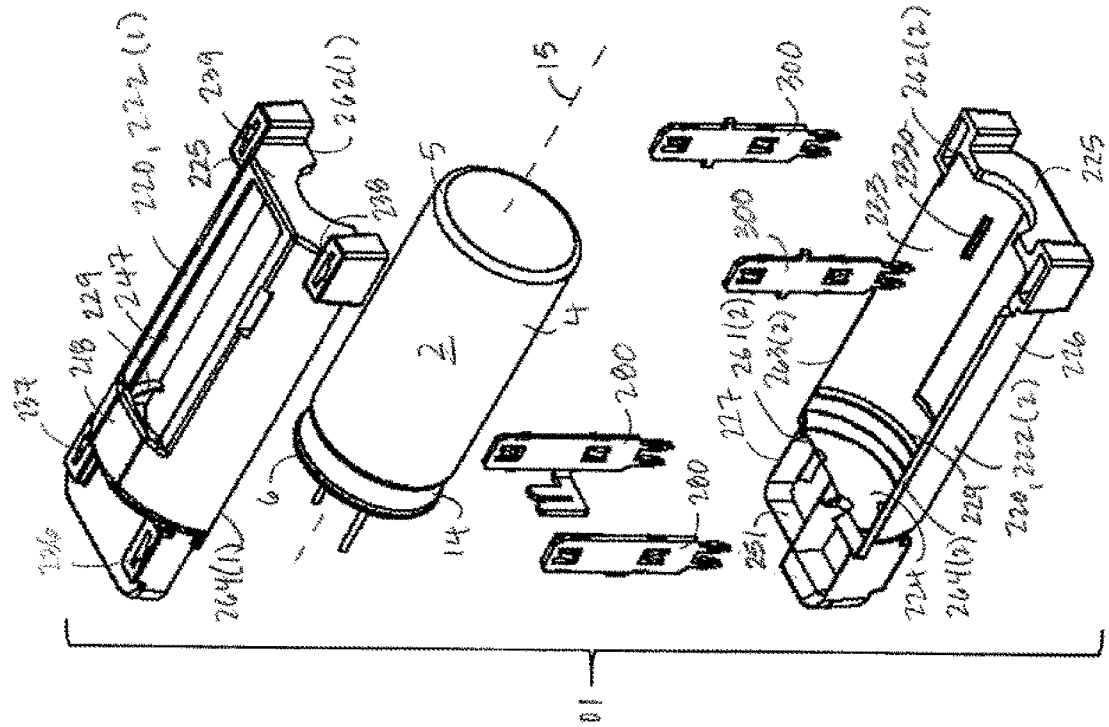
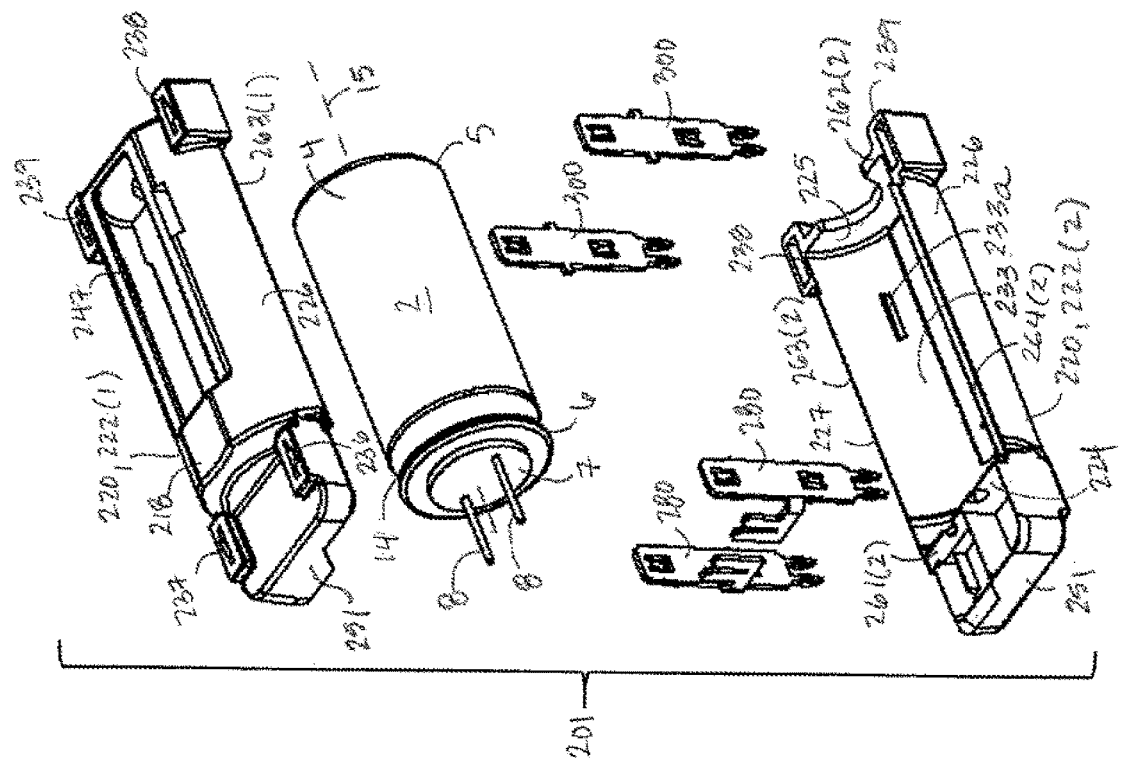

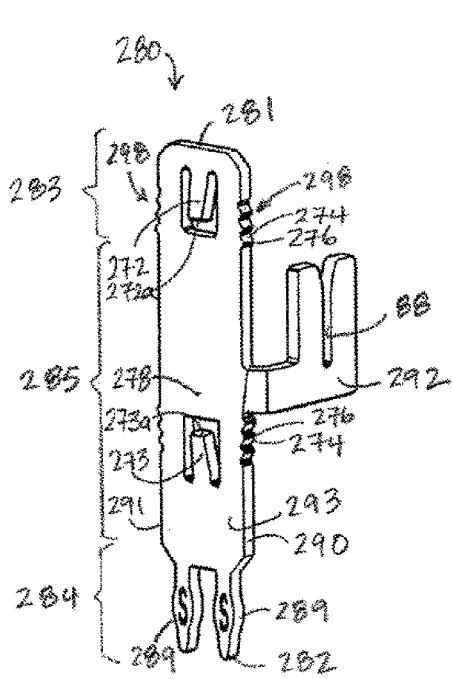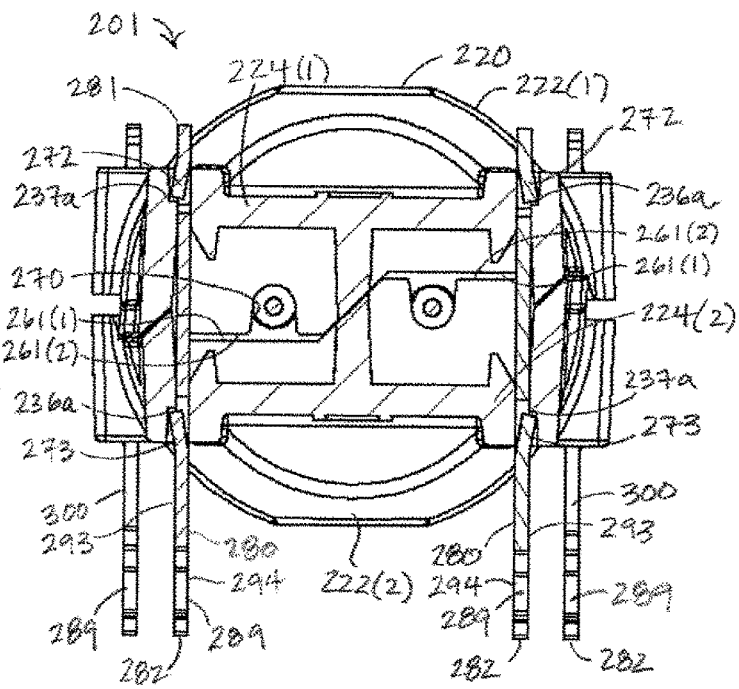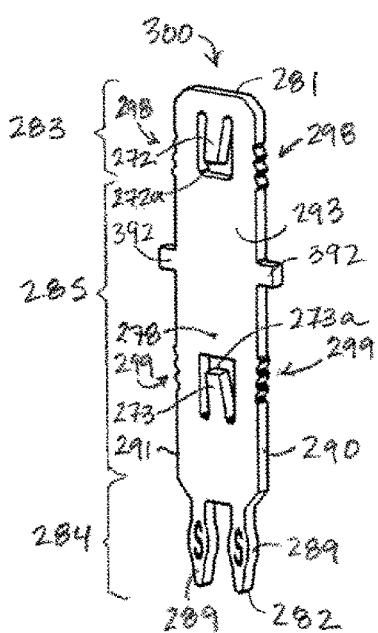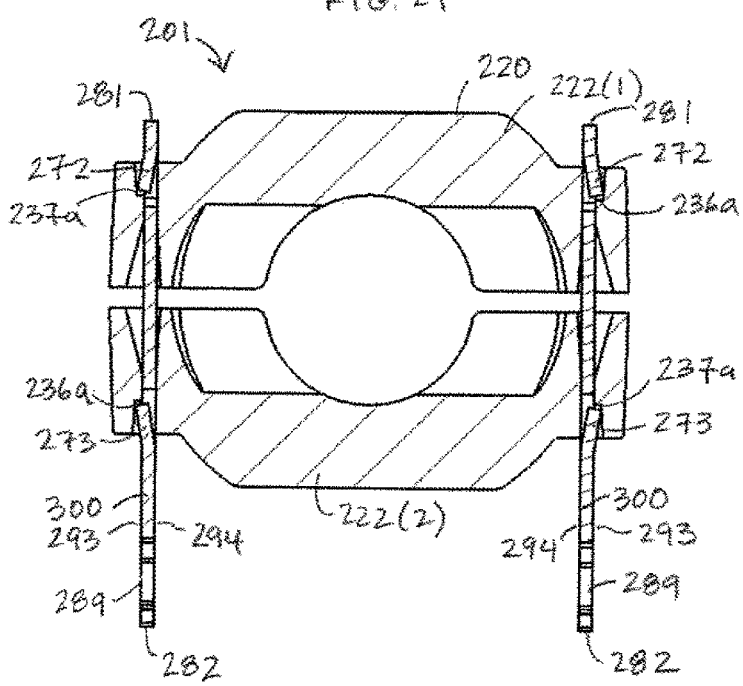

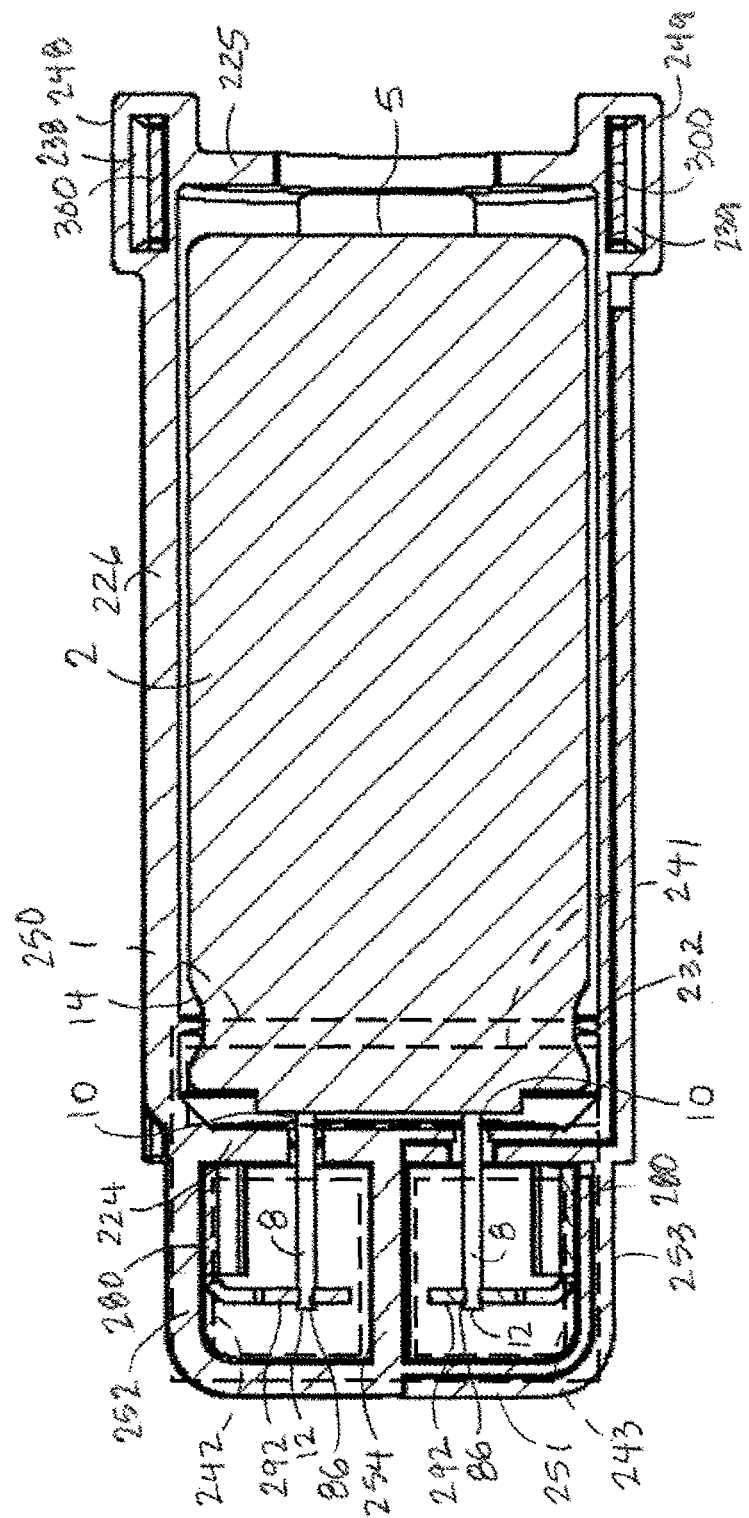

CAPACITOR CARRIER ASSEMBLY WITH HOUSING HAVING ENCAPSULATION FEATURES

BACKGROUND

Capacitors used in electronic devices include capacitor leads that may be electrically connected to a printed circuit board (PCB) or other electronic component or device. For example, the capacitor leads may be electrically connected to connection terminals provided on the PCB. To preserve the electrical connection, the capacitor may be mechanically secured against movement relative to the PCB due to vibration or shock. In some applications, a capacitor carrier that is mounted to the PCB is used to mechanically secure the capacitor relative to the PCB.

In some electronic devices employing capacitors, there is a potential for tin whiskers to grow at the proximal end of the capacitor lead, e.g., at the location the capacitor lead exits the capacitor casing. In addition, there is potential for tin whiskers to grow at the location at which the capacitor leads are electrically connected to the connection terminals, e.g., adjacent to the distal end of the capacitor lead. Still further, there is potential for tin whiskers to grow at the location at which the connection terminals are electrically connected to the PCB. If the tin whiskers become broken, the tin whiskers can create an unwanted electrical connection between components or leads of the PCB, for example by creating an electrical short circuit. Although it is possible to prevent growth of tin whiskers via application of coatings to the capacitor leads, and/or using a soldering process to form certain electrical connections, such prevention measures can be expensive to implement in terms of materials and/or labor.

SUMMARY

In some aspects, a capacitor carrier is configured to support a capacitor. The capacitor includes a casing, a first capacitor lead and a second capacitor lead. The first and second capacitor leads protrude from one end of the casing. The carrier includes wall structures that are configured to encapsulate at least a portion of each of the first capacitor lead and the second capacitor lead.

In some embodiments, the carrier includes an electrically conductive first connection terminal and an electrically conductive second connection terminal. The first connection terminal and the second connection terminal are each supported by the carrier. The first connection terminal includes a first body portion that is configured to be electrically connected to the first capacitor lead at a first connection location, and a first device connection portion that protrudes from the carrier. The second connection terminal includes a second body portion that is configured to be electrically connected to the second capacitor lead at a second connection location, and a second device connection portion that protrudes from the carrier. The wall structures are configured to provide an encapsulation chamber that encapsulates at least a portion of the capacitor, and when the capacitor is disposed in the carrier, the first connection location and the second connection location are disposed in the encapsulation chamber.

In some embodiments, the carrier is configured to support the capacitor in such a way that at least a portion of the casing is disposed outside the encapsulation chamber.

In some embodiments, the encapsulation chamber includes a first zone, and a second zone that is segregated from the first zone by at least one of the wall structures, the first connection location is disposed in the first zone, and the second connection location is disposed in the second zone.

In some embodiments, the encapsulation chamber includes a third zone that is segregated from the first zone and the second zone by at least one of the wall structures. The third zone is configured to encapsulate a portion of the capacitor that includes the location at which each of the respective first and second capacitor leads exits the capacitor casing.

In some embodiments, the wall structures comprise a first portion and a second portion. The first portion of the wall structures of the carrier are arranged to provide a first container portion. The second portion of the wall structures of the carrier are arranged to provide a second container portion. The second container portion is configured to be assembled with the first carrier portion in such a way that the capacitor can be disposed between the first container portion and the second container portion.

In some embodiments, each of the first container portion and the second container portion include a hemi-cylindrical portion that is configured to receive and support at least a portion of the casing, and a rectangular prism portion that is configured to receive at least a portion of the first capacitor lead and the second capacitor lead.

In some embodiments, the hemi-cylindrical portion includes a first side, and a second side that is parallel to, and spaced apart from the first side. In addition, the hemi-cylindrical portion includes a third side that extends between the first side and the second side. The third side includes a curved portion configured to partially surround a longitudinal axis that is perpendicular to the first side and the second side.

In some embodiments, the hemi-cylindrical portion includes a separating member that protrudes from an inner surface of the third side. The separating member includes a separating member cut out that has a curved shape and dimensions that correspond to a shape and dimensions of a portion the casing. The separating member cut out is configured to face the portion of the casing. The separating member of the first container portion cooperates with the separating member of the second container portion to form an interior wall that is parallel to the first and second sides, and the interior wall is one of the wall structures that encapsulate the capacitor leads.

In some embodiments, the rectangular prism portion includes a first longitudinal wall portion, a second longitudinal wall portion that is parallel to the first longitudinal wall portion and a first transverse wall portion. The first transverse wall portion is perpendicular to, and extends between, the first longitudinal wall portion and the second longitudinal wall portion. The rectangular prism portion includes a second transverse wall portion that is parallel to the first transverse wall portion, and extends between the first longitudinal wall portion and the second longitudinal wall portion. The rectangular prism portion includes a third longitudinal wall portion that is parallel to the first longitudinal wall portion, and extends between the first transverse wall portion and the second transverse wall portion. The third longitudinal wall portion is disposed between the first longitudinal wall portion and the second longitudinal wall portion. In addition, the rectangular prism portion includes a floor portion. The first longitudinal wall portion, the second longitudinal wall portion, the first transverse wall portion and the second transverse wall portion are arranged to form a closed rectangular section. The floor portion closes one end of the closed rectangular section. The rectangular prism portion of the first container portion cooperates with the rectangular prism portion of the second container portion to provide a first encapsulation zone which encapsulates a portion of the first capacitor lead, and a second encapsulation zone which encapsulates a portion of the second capacitor lead, where the second capsulation zone is separated from the first encapsulation zone by the third longitudinal wall portion.

In some aspects, a capacitor carrier assembly includes the carrier described above, and a capacitor disposed in the carrier.

In some aspects, a capacitor carrier is provided that encapsulates portions of the capacitor including joint interfaces where growth of tin whiskers can occur. By encapsulating portions of the capacitor, including joint interfaces where growth of tin whiskers can occur, tin whiskers that are present in the device are retained within an enclosed space within the carrier, whereby risk of an electrical short circuit condition is avoided.

The carrier is configured to securely mechanically support a capacitor with respect to an electronic component or device such as a PCB, and provide an electrical connection between the capacitor and the electronics device. The carrier is a receptacle that includes a sidewall, a cover that closes an open end of the sidewall, and a cradle portion that protrudes from the sidewall and cooperates with the cover to retain the capacitor within the carrier. In some embodiments the cover is formed separately from the sidewall, and in other embodiments, one edge of the cover is connected to the sidewall via a living hinge.

The sidewall and the cover include wall structures that enclose the capacitor leads, whereby in the event of whisker formation, contact between the whiskers and the PCB, and components thereof, can be avoided.

The carrier includes electrically conductive connection terminals that electrically connect the capacitor leads to the PCB. The cover is retained in a closed position relative to the sidewall via the connection terminals. In some embodiments, the cover that is retained in a closed position relative to the sidewall via the connection terminals also includes latches that secure the cover to the sidewall, and in other embodiments, the latches may be omitted.

In some embodiments, the carrier housing is an assembly of two container-shaped housing portions, and the housing portions are identical in shape and dimension. As a result, a single part can be used for both of the housing portions, whereby manufacturing logistics are simplified and costs are reduced relative to embodiments in which the two housing portions are different.

In some embodiments, the mating edges of the two container-shaped housings are "shingled", which allows the carrier housing to expand or contract to accommodate capacitors of various diameters, while still enclosing the capacitor within the carrier housing. As used herein, the term "shingled" refers to providing acutely-angled mating or joined edges of the housing portions so that such that the joined edges are overlapping when the carrier housing is viewed in side view.

BRIEF DESCRIPTION OF THE FIGURES

FIG. 19 is an exploded front perspective view of the capacitor carrier assembly of FIG. 17.

FIG. 20 is an exploded rear perspective view of the capacitor carrier assembly of FIG. 17.

FIG. 28 is a perspective view of a connection terminal of the capacitor carrier assembly of FIG. 17.

FIG. 29 is a cross-sectional view of the capacitor carrier assembly of FIG. 17 as seen along line 29-29 of FIG. 17.

FIG. 30 is a perspective view of a support terminal of the capacitor carrier assembly of FIG. 17.

FIG. 31 is a cross-sectional view of the capacitor carrier assembly of FIG. 17 as seen along line 31-31 of FIG. 17.

FIG. 32 is a cross-sectional view of the capacitor carrier assembly of FIG. 17 as seen along line 32-32 of FIG. 17, where broken lines represent the encapsulation chamber and zones within the encapsulation chamber.

DETAILED DESCRIPTION

Figure 1:
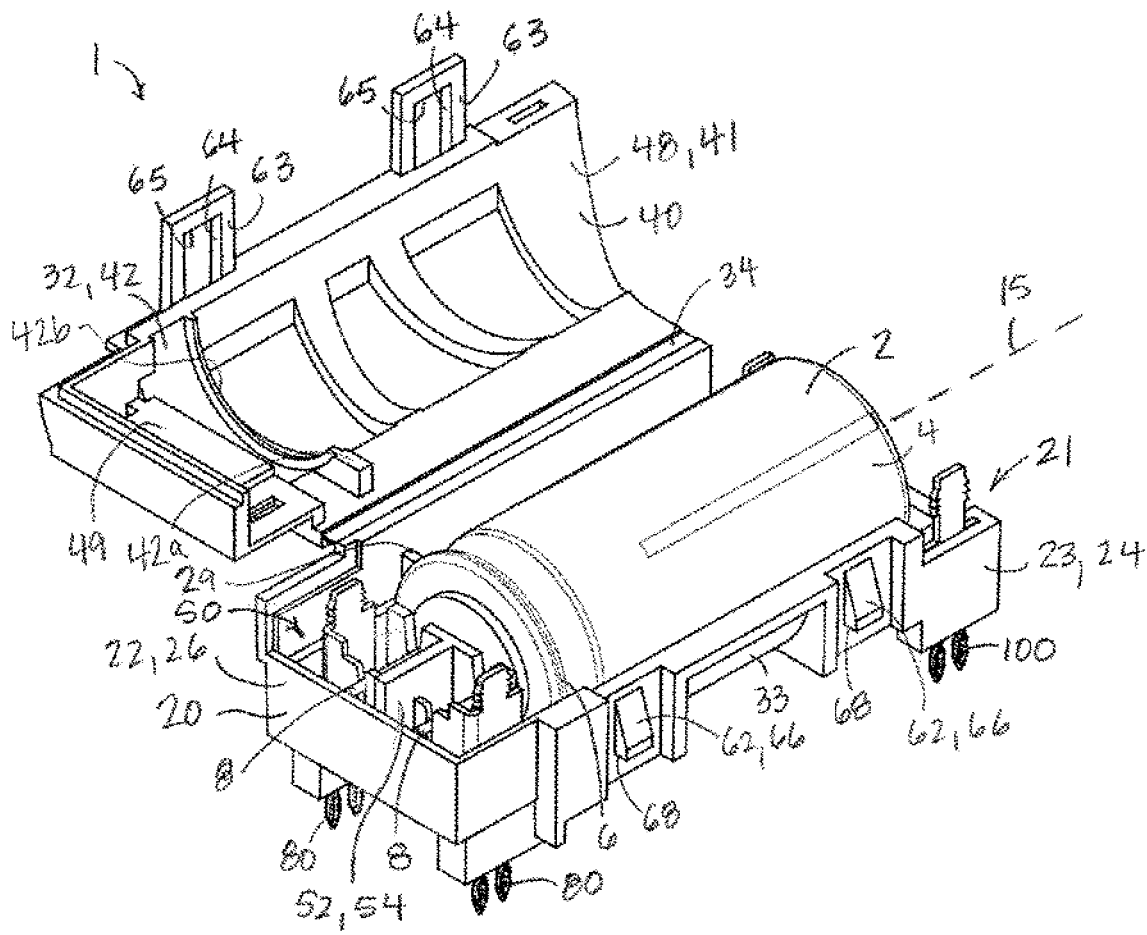
FIG. 1 is a front perspective view of a capacitor carrier assembly shown with the carrier cover open and with a capacitor disposed in the carrier.

Referring to FIGS. 1-5, a capacitor carrier assembly 1 mechanically supports a capacitor 2 relative to an electronic component or device such as a PCB 18, and provides an electrical connection between the capacitor 2 and the PCB 18. The capacitor carrier assembly 1 includes a carrier 20, and the capacitor 2 disposed in the carrier 20. In addition, the capacitor carrier assembly 1 includes electrically conductive connection terminals 80 and support terminals 100. The connection terminals 80 are supported by the carrier 20, and provide an electrical connection between leads 8 of the capacitor 2 and contact sockets 19 of the PCB 18. The support terminals 100 are supported by the carrier 20 and, along with the connection terminals 80, mechanically secure the carrier 20 to the PCB 18. The carrier 20 is a receptacle that receives and retains the capacitor 2 with respect to the PCB 18. In addition, the carrier 20 includes wall structures that enclose the capacitor leads 8 as discussed further below, whereby in the event of whisker formation, contact between the whiskers and the PCB 18, and components thereof, can be avoided.

The capacitor 2 may be, for example, an electrolytic radial capacitor. The capacitor 2 includes a capacitor casing 4 having a generally cylindrical shape including a closed first end 5 and an opposed, open second end 6. The capacitor casing 4 is elongated along a longitudinal axis 15 that is perpendicular to the capacitor first and second ends 5, 6 and that is co-linear with a centerline of the casing 4. The second end 6 is plugged via rubber bung 7, and the casing 4 is crimped around the bung 7 to form an air tight seal between the casing 4 and the bung 7. At the location of the crimp, the casing 4 includes an annular region 14 having a decreased diameter relative to the diameter of the casing 4 at each end 5, 6. The annular region 14 extends around the circumference of the capacitor 2, and is disposed near the second end 6 (e.g., between the second end 6 and a mid point of the capacitor 2).

The capacitor 2 includes the pair of capacitor leads 8 that protrude longitudinally and linearly from the bung 7 that is disposed in the casing second end 6. Each of the capacitor leads 8 includes a proximal end 10 corresponding to the location at which the capacitor lead 8 exits the capacitor 2, and a distal end 12 that is opposed to the proximal end and is spaced apart from the bung 7.

Referring also to FIGS. 6-15, the carrier 20 includes wall structures 21 that are configured to support, and at least partially surround, the capacitor 2.

The wall structures 21 include a sidewall 23 arranged to form a closed rectangular section. To that end, the sidewall 23 includes a first side 24, and a second side 25 that is parallel to, and spaced apart from, the first side 24 and from the capacitor longitudinal axis 15. The sidewall 23 includes a third side 26 that faces the capacitor second end 6. The third side 26 connects the first side 24 to the second side 25, and is perpendicular to the first and second sides 24, 25. The sidewall 23 includes a fourth side 27 that faces the capacitor first end 5. The fourth side 27 is parallel to, and spaced apart from, the third side 26, and connects the first side 24 to the second side 25.

The first side 24 includes a connection terminal opening 36 disposed near the third side 26, and a support terminal opening 38 disposed near the fourth side 27. Similarly, the second side 25 includes a connection terminal opening 37 disposed near the third side 26 and a support terminal opening 39 disposed near the fourth side 27. The openings 36, 37, 38, 39 receive and retain the respective connection and support terminals 80, 100 as discussed in detail below.

Figure 2:
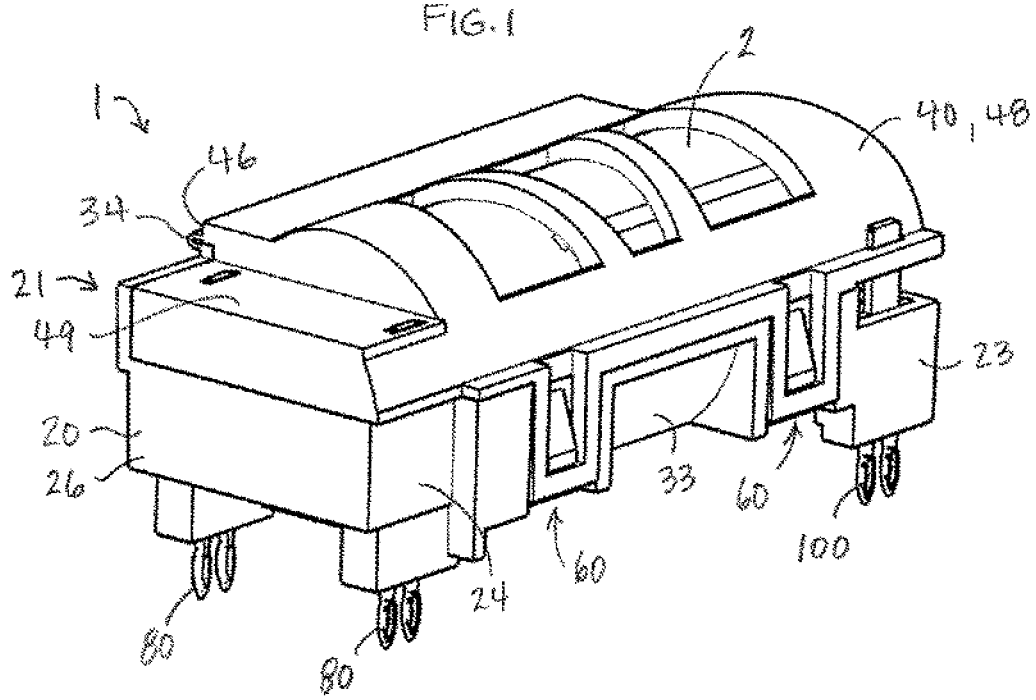
FIG. 2 is a front perspective view of the capacitor carrier assembly of FIG. 1, shown with the carrier cover closed and with the capacitor disposed in the carrier.
Figures 3, 4:
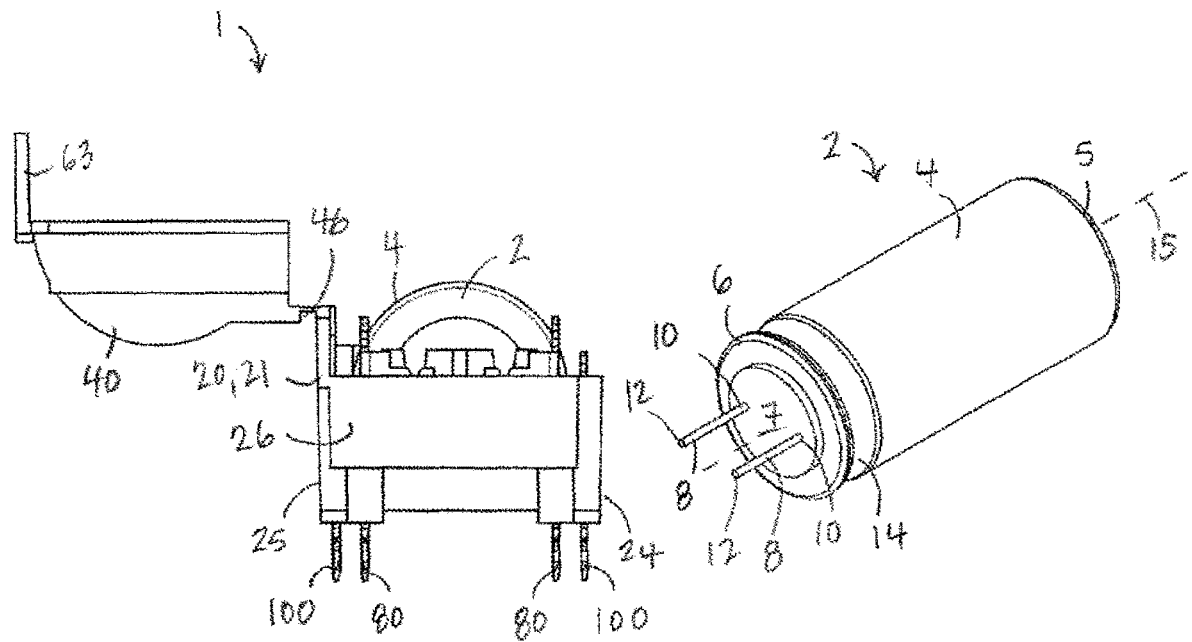
FIG. 3 is an end view of the capacitor carrier assembly of FIG. 1, shown with the carrier cover open and with the capacitor disposed in the carrier.
FIG. 4 is a perspective view of the capacitor.
Figure 9:
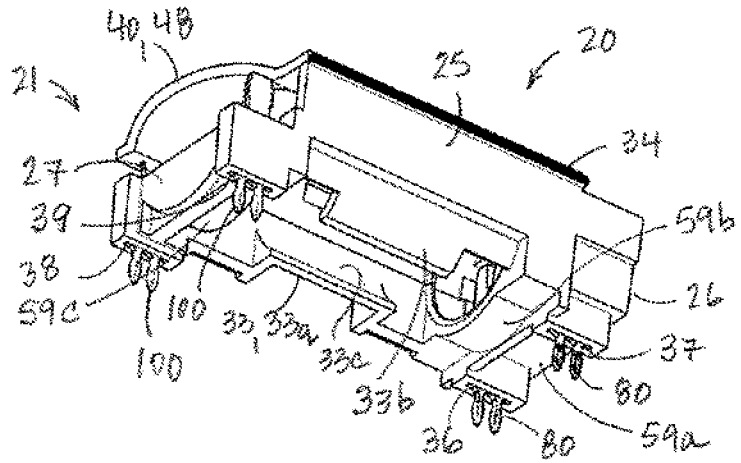
FIG. 9 is a bottom perspective view of the capacitor carrier assembly of FIG. 2, shown with the capacitor omitted.
Figure 10:
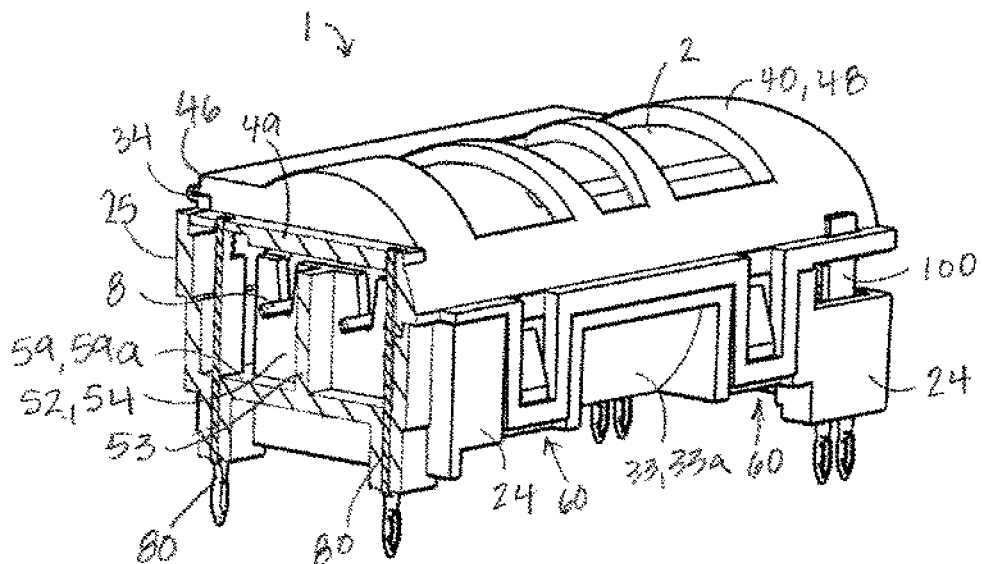
FIG. 10 is a perspective cross-sectional view of the capacitor carrier assembly of FIG. 2 as seen along line 10-10 of FIG. 6.
Figure 11:
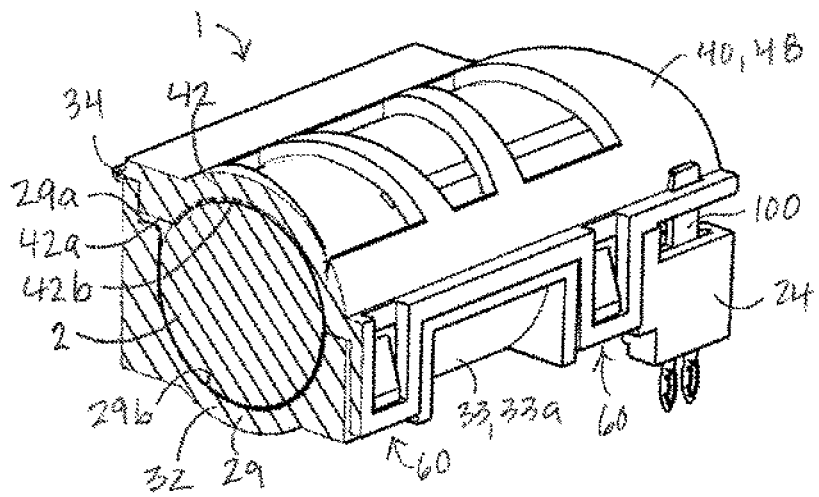
FIG. 11 is a perspective cross-sectional view of the capacitor carrier assembly of FIG. 2 as seen along line 11-11 of FIG. 6.
Figure 12:
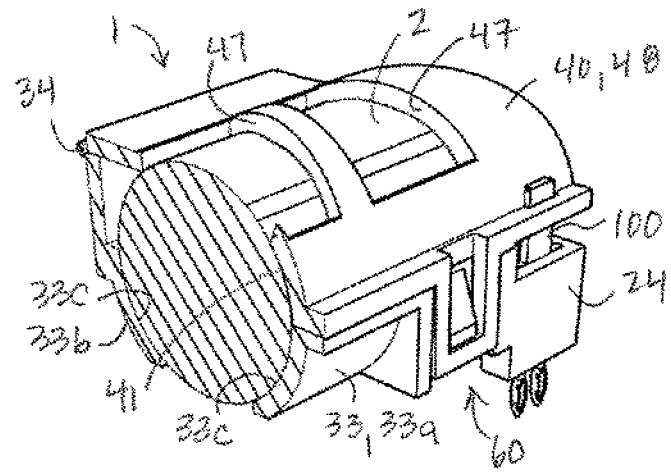
FIG. 12 is a perspective cross-sectional view of the capacitor carrier assembly of FIG. 2 as seen along line 12-12 of FIG. 6.
Figure 13:
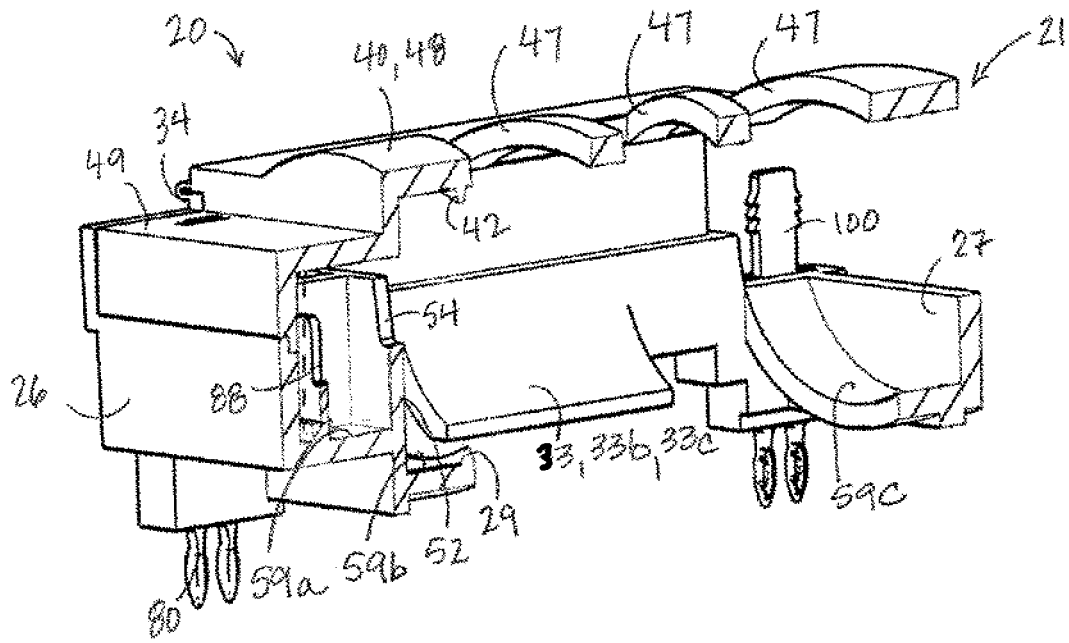
FIG. 13 is a perspective cross-sectional view of the capacitor carrier assembly of FIG. 2 as seen along line 13-13 of FIG. 6, shown with the capacitor omitted.
Figure 14:
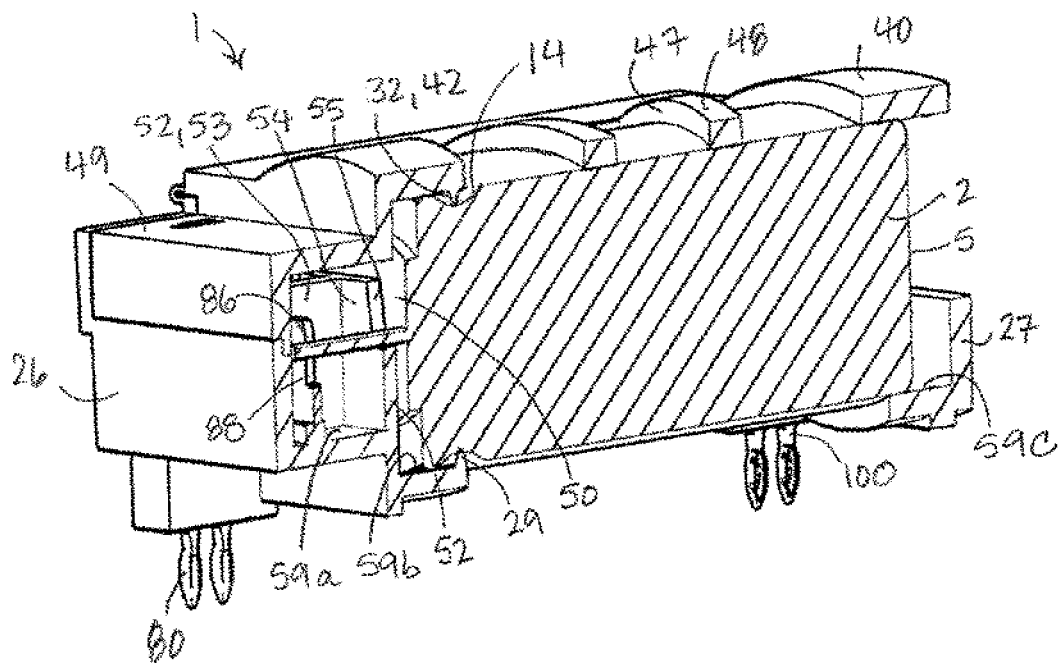
FIG. 14 is a perspective cross-sectional view of the capacitor carrier assembly of FIG. 2 as seen along line 13-13 of FIG. 6, shown with the capacitor disposed in the carrier.
Figure 15:
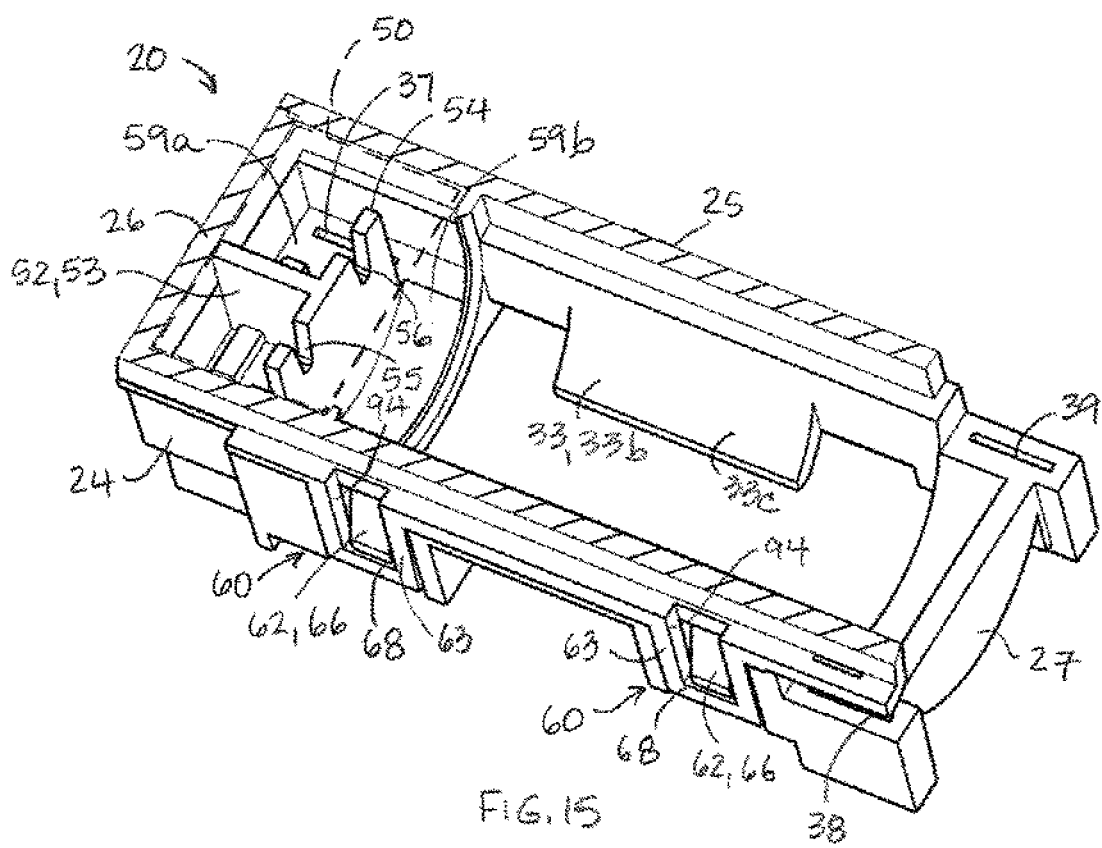
FIG. 15 is a perspective cross-sectional view of the capacitor carrier assembly of FIG. 2 as seen along line 15-15 of FIG. 7, shown with the capacitor, connection terminals and support terminals omitted.

The sidewall 23 also includes a cradle 33 that protrudes inward from the sidewall 23 and is configured to support the capacitor 2 within the sidewall. The cradle 33 includes a first cradle portion 33a that protrudes inward from the sidewall first side 24, and a second cradle portion 33b that protrudes inward from the sidewall second side 25 (FIG. 9). Although the first and second cradle portions 33a, 33b extend toward each other, a gap exists between them. The first and second cradle portions 33a, 33b each define a curved capacitor-facing surface 33c that is concave and has a partial circular profile when viewed in cross section (FIG. 12). More specifically, the capacitor-facing surface 33c has a shape that corresponds to the shape and dimensions of a portion of a surface of the capacitor casing 4. When the capacitor 2 is disposed in the carrier 20 oriented as shown in FIG. 2, the capacitor 2 rests on the cradle 33 and is surrounded by the first, second, third and fourth sides 24, 25, 26, 27.

In addition to the sidewall 23, the wall structures 21 include a cover 40 that selectively closes one end (e.g., an upper end) of the sidewall 23. The cover 40 closes one end of the sidewall 23 and includes a curved portion 48 and a planar portion 49 (FIG. 2). The planar portion 49 of the cover 40 overlies the capacitor leads 8 and a floor member 59a, which is discussed below. The planar portion 49 includes a pair of elongated openings 43, 44 that are configured to receive and retain ends of the connection terminals 80, as discussed in detail below. The curved portion 48 of the cover 40 overlies the cradle 33 and the capacitor 2 supported thereon. The inward-facing surface 41 of the curved portion 48 is concave and has a partial circular profile when viewed in cross section (FIG. 12). More specifically, the inward-facing surface 41 of the curved portion 48 has a shape that corresponds to the shape and dimensions of a portion of a surface of the capacitor casing 4. The curved portion 48 also includes cover openings 47 that advantageously allow a determination of whether a capacitor 2 is disposed in the carrier 20 upon visual inspection, even when the cover 40 is closed. In the illustrated embodiment, the cover 40 includes three, relatively large cover openings 47. For example, the sum of the three areas defined by the cover openings 47 is at least half the total area of the curved portion 48. In addition, the curved portion 48 includes an elongated opening 45 at a location that overlies the sidewall first side 24. The opening 45 is configured to receive and retain an end of one of the support terminals 100, as discussed in detail below.

A living hinge 34 extends along a rear edge 46 of the cover 40 and joins the rear edge 46 of the cover 40 to the second side 25 of the sidewall 23. Thus the cover 40, the living hinge 3 and the sidewall 23 are integrally formed. In the illustrated embodiment, the living hinge 34 is a single, continuous hinge that extends along the curved portion 48, whereas the planar portion 49 is hinge free. In other embodiments, the living hinge 34 may be discontinuous. The living hinge 34 is thin relative to the thickness of the sidewall second side 25 or the cover 40 so that the living hinge 34 is easily folded.

The wall structures 21 also include floor members 59a, 59b and 59c (FIG. 10) that close a portion of the end (e.g., a lower end) of the sidewall 23 that is opposed to the cover 40. The first floor member 59a is a planar member that underlies the cover planar portion 49. The first floor member 59a extends between the sidewall first side 24 and the sidewall second side 25 and abuts the sidewall third side 26. The second and third floor members 59b and 59c are curved to conform to the shape and dimensions of the outer surface of the capacitor 2, and underlie the cover curved portion 48. The second and third floor members 59b and 59c extend between the sidewall first side 24 and the sidewall second side 25. The second floor member 59b is disposed between the first floor member 59a and the cradle 33, and supports the second end 6 of the capacitor 2. The third floor member 59c is disposed between the cradle 33 and the sidewall fourth side 27, and supports the first end 5 of the capacitor 2.

The wall structures 21 also include a first separating member 29 and second separating member 42 (FIGS. 1 and 11) that are configured to engage the capacitor casing 4 along the annular region 14, whereby the capacitor 2 is retained in a desired longitudinal position relative to the capacitor carrier 20.

In particular, the first separating member 29 protrudes from the second floor member 59b toward the cover 40. The first separating member 29 is in the form of a planar wall that is parallel to the sidewall third and fourth sides 26, 27. Fixed edges of the first separating member 29 abut the side wall first side 24, the second floor member 59b and the sidewall second side 25. The first separating member 29 includes a free edge 29a that faces the cover 40, and the free edge 29a includes a curved first cut out 29b. The first cut 29b out has a shape and dimensions that correspond to the shape and dimensions of the capacitor annular region 14.

The second separating member 42 protrudes from the curved portion 48 of the cover 40 toward the second floor member 59. The second separating member 42 is in the form of a planar wall that is parallel to the sidewall third and fourth sides 26, 27. Fixed edges of the second separating member 42 abut the inner surface of the cover curved portion 48. The second separating member 42 includes a free edge 42a that faces the second floor member 59b, and the free edge 42a includes a curved second cut out 42b. The second cut out 42b has a shape and dimensions that correspond to the shape and dimensions of the capacitor annular region 14.

The first cut out 29b and the second cut out 42b are received within the capacitor annular region 14 and, in combination, extend along substantially the entire circumference of the capacitor 2 within the annular region 14. By this configuration, the first separating member 29 and the second separating member 42 cooperate to form an interior wall 32 that closely encircles the capacitor 2 within the annular region 14. As a result, the capacitor 2 is retained in a desired longitudinal position relative to the sidewall third and fourth sides 26, 27. Moreover, any whiskers that form at the proximal end 10 of the capacitor leads 8 is retained between the interior wall 32 and the sidewall third side 26.

The wall structures 21 further include a T-shaped lead support wall 52 (FIGS. 1 and 9) that protrudes from the first floor member 59a and is disposed in the carrier 20 between the interior wall 32 and the third side 26 of the sidewall 23.

A small gap exists between an upper edge of the lead support wall 52 and the planar portion 49 of the cover 40. As used herein, references to direction such as upper, lower, top, bottom, above, below, over, under, etc., are made with respect to the orientation of the capacitor carrier assembly 1 shown in FIG. 2. It is understood that the capacitor carrier assembly 1 is not limited to being employed in the orientation shown in FIG. 2.

The lead support wall 52 has a transverse portion 54 that is parallel to the sidewall third and fourth sides 26, 27. A small gap exists between lateral ends of the transverse portion 54 and respective sidewall first and second sides 24, 25. In addition, the lead support wall 52 has a longitudinal portion 53 that is parallel to the sidewall first and second sides 24, 25, and extends between the sidewall third side 26 and the transverse portion 54. The longitudinal portion 53 abuts the transverse portion 54 at a midpoint of the transverse portion 54, and abuts the sidewall third side 26 at a midpoint of the sidewall third side 26. The transverse portion 54 of the lead support wall 52 faces the capacitor second end 6, and includes first and second lead-receiving cut-outs 55, 56 that open along the upper edge of the transverse portion 54. The first lead-receiving cut out 55 is disposed between the longitudinal portion 53 and the sidewall first side 24, and the second lead-receiving cut out 56 is disposed between the longitudinal portion 53 and the sidewall second side 25. When the capacitor 2 is disposed in the carrier 20, a first one of the capacitor leads 8 extends through the first lead-receiving cut out 55, and a second one of the capacitor leads 8 extends through the second lead receiving cut out 56.

By this configuration, the proximal ends 10 of the capacitor leads 8 are disposed on an opposite side of the transverse portion 54 from the distal ends 12. In addition, the connection terminals 80 are disposed on opposed sides of the transverse portion 54 of the lead support wall 52. The proximal ends 10 and the distal ends 12 of the capacitor leads, including the locations at which the capacitor leads 8 are connected to the connection terminals 80 (e.g., the connection locations) are encapsulated in a closed interior space referred to hereafter as an encapsulation chamber 50. The encapsulation chamber 50 is defined between the interior wall 32 and the sidewall third side 26, between portions of the sidewall first and second sides 24, 25 adjacent the third side 26, and between the first floor member 59a and the cover planar portion 49.

The encapsulation chamber 50 is configured to retain therein any whiskers that may form on the capacitor leads 8, whereby contact between the whiskers and the PCB 18, and components thereof, can be avoided. Moreover, the encapsulation chamber 50, which includes the transverse portion 54 of the lead support wall 52, segregates the locations at which the capacitor leads 8 are connected to the connection terminals 80 from the lead proximal ends 10. Still further, the encapsulation chamber 50, which includes the longitudinal portion 53 of the lead support wall 52, segregates the locations at which the capacitor leads 8 are connected to the connection terminals 80 from each other. Segregation of the locations at which the capacitor leads 8 are connected to the connection terminals 80 from the lead proximal ends 10, and from each other, may prevent whiskers from forming an electrical short circuit between the capacitor leads 8.

Figure 5:
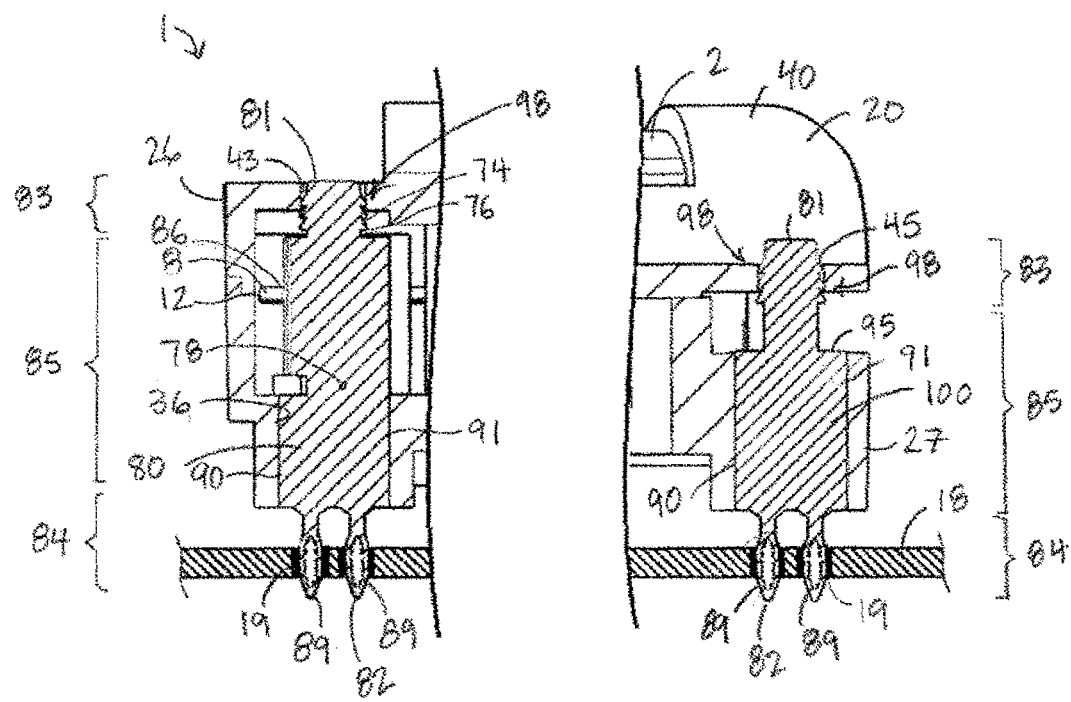
FIG. 5 is a side cross-sectional view of the capacitor carrier assembly of FIG. 2 as seen along line 5-5 of FIG. 6.
Figure 6:
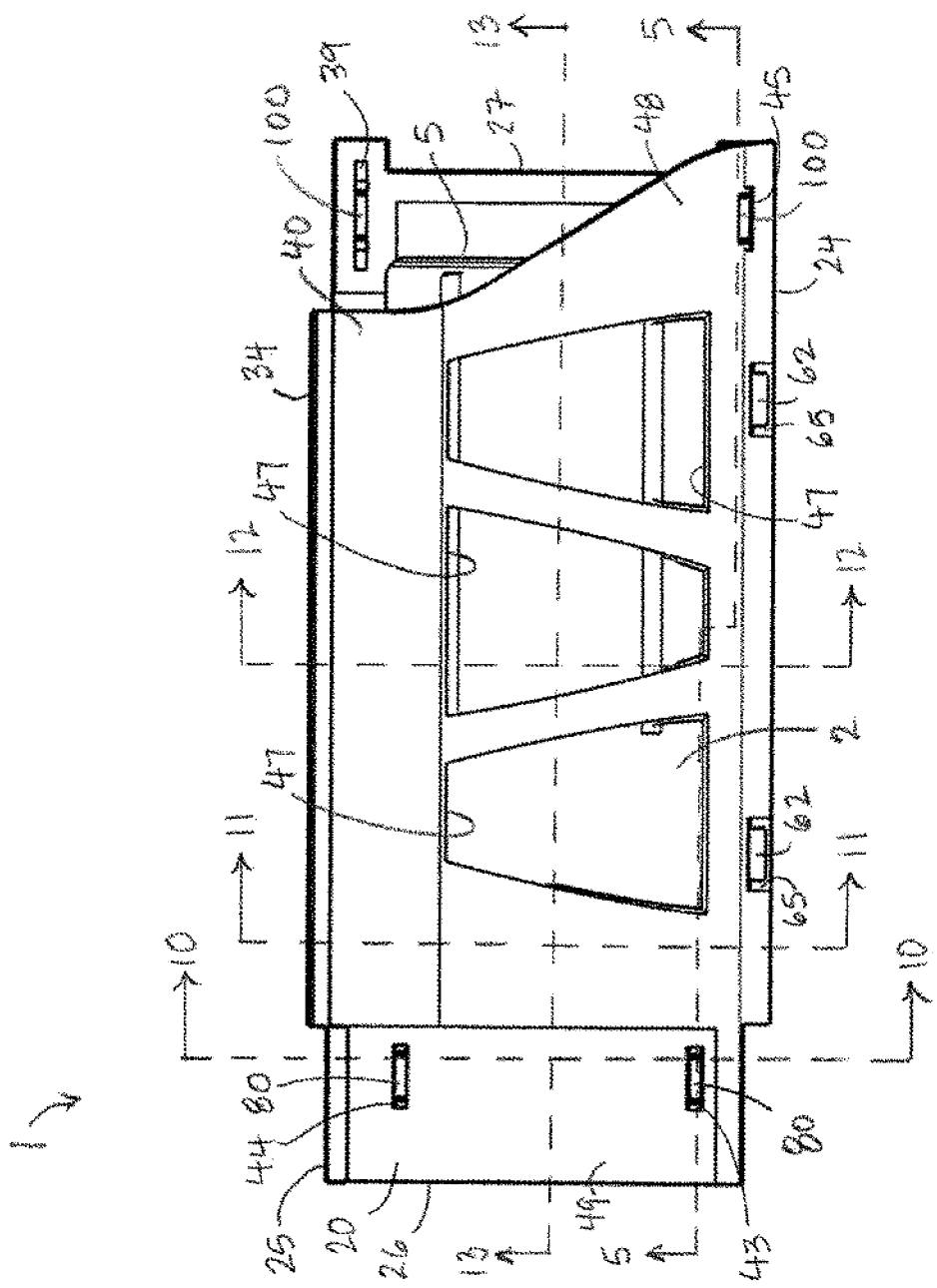
FIG. 6 is a top view of the capacitor carrier assembly of FIG. 2.
Figure 7:
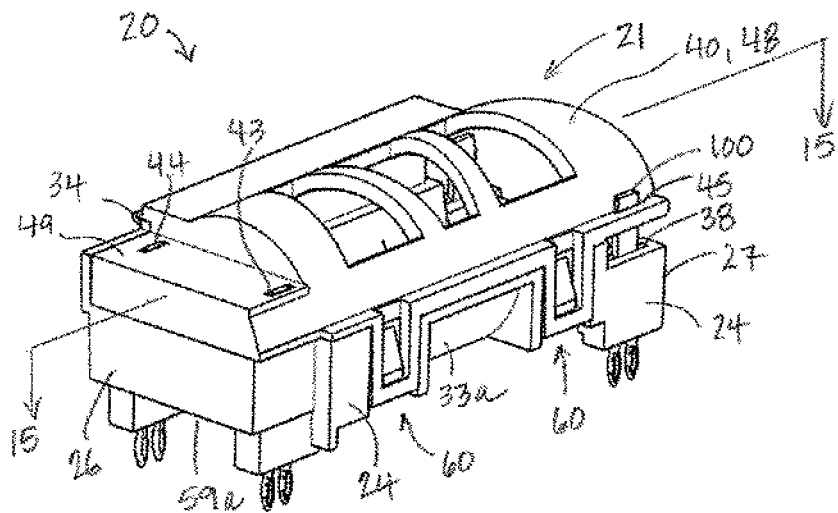
FIG. 7 is a front perspective view of the capacitor carrier assembly of FIG. 2, shown with the capacitor omitted.
Figure 8:
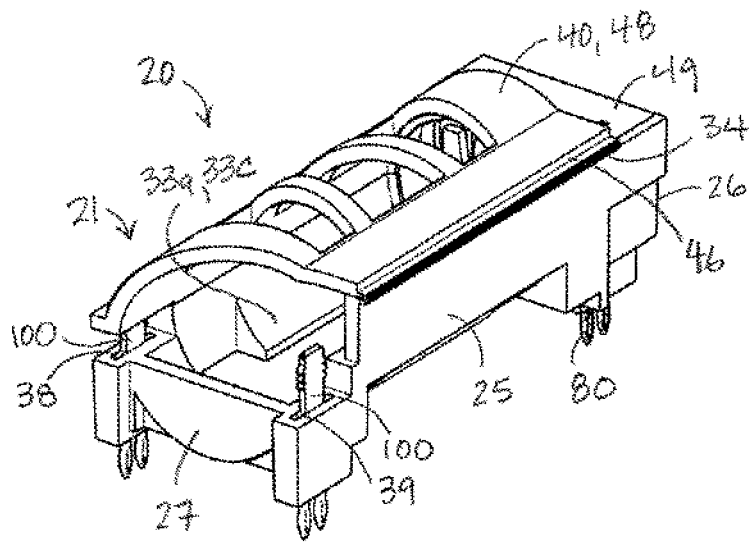
FIG. 8 is a rear perspective view of the capacitor carrier assembly of FIG. 2, shown with the capacitor omitted.
Figure 16:
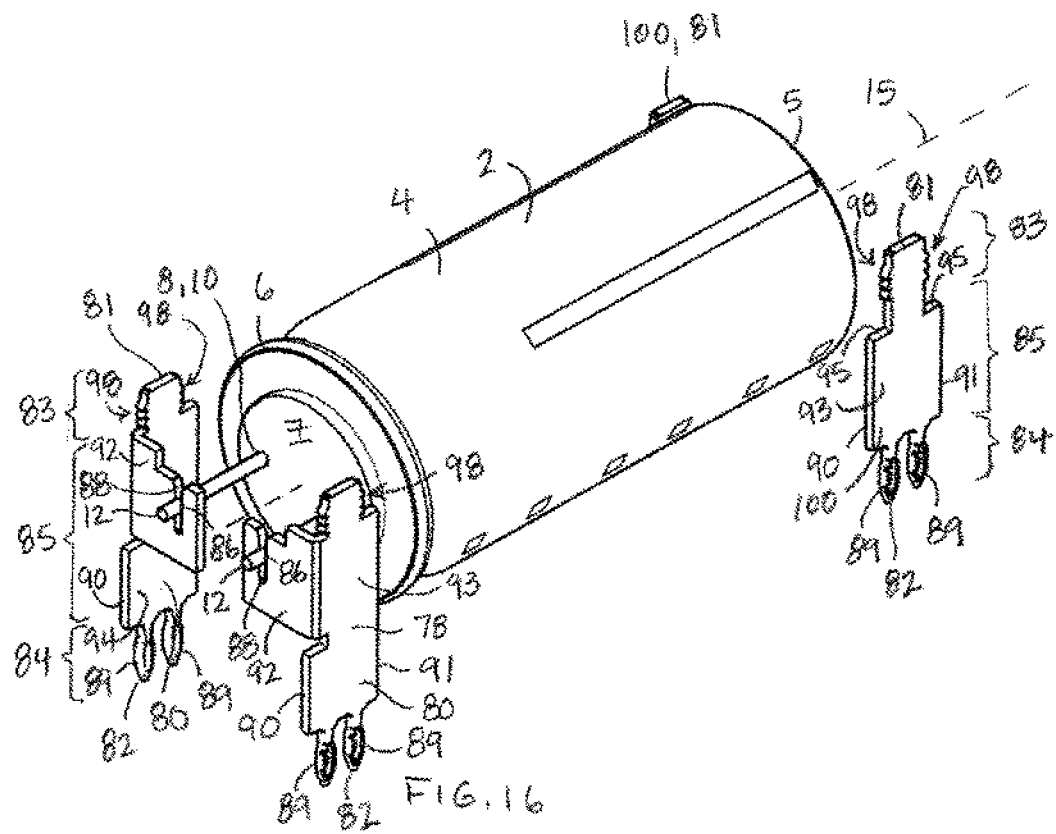
FIG. 16 is a perspective view of the capacitor, connection terminals and support terminals isolated from the remainder of the capacitor carrier assembly.

Referring to FIGS. 5 and 16, the capacitor carrier assembly 1 includes the pair of electrically conductive connection terminals 80 and a pair of electrically conductive support terminals 100. The connection terminals 80 and the support terminals 100 mechanically secure the carrier 20 to the PCB 18. In addition, the connection terminals 80 electrically connect the capacitor leads 8 to the PCB contact sockets 19. Still further, the connection terminals 80 and one of the support terminals 100 mechanically secure the cover 40 to the sidewall 23. The connection terminals 80 and the support terminals 100 will now be described in detail.

The connection terminals 80 are press fit into the connection terminal openings 36, 37 provided in the carrier 20 at a location adjacent to the capacitor second end 6 and the capacitor leads 8.

Each connection terminal 80 is an electrically conductive thin plate that includes a first end 81, a second end 82 that is opposed to the first end 81, and a midpoint 78 disposed mid way between the first end 81 and the second end 82. Each connection terminal 80 includes a first side edge 90 that extends between the first end 81 and the second end 82, and a second side edge 91 that is parallel to the first side edge 90 and extends between the first end 81 and the second end 82. The connection terminal 80 is elongated such that the distance between the first side edge 90 and the second side edge 91 is less than the distance between the first end 81 and the second end 82. Each connection terminal 80 includes a first surface 93, and a second surface 94 that is opposed to the first surface 93. The first and second surfaces 93, 94 are bounded by the first end 81, the second end 82, the first side edge 90 and the second side edge 91.

The connection terminal second end 82 includes a plug 89 that is configured to be press fit into an electrically conductive socket. In the illustrated embodiment, the connection terminal second end 82 includes a pair of plugs 89 that are disposed side-by-side, and are configured to be received in the contact socket 19 of the PCB 18. In use, the plugs 89 provide an electrical and mechanical connection between the connection terminal 80 and the PCB 18.

The first and second side edges 90, 91 of each connection terminal 80 include a serrated region 98. In particular, the serrated region 98 is disposed on each of the first and second side edges 90, 91 at a location disposed between the first end 81 and the midpoint 78. The serrated region 98 includes a series of closely-spaced protruding ridges 74, where each ridge 74 terminates in an apex 76.

Each connection terminal 80 includes a cover retention portion 83, a PCB connection portion 84, and a body portion 85 disposed between the cover retention portion 83 and the PCB connection portion 84.

The connection terminal cover retention portion 83 includes the connection terminal first end 81 and the serrated region 98. The cover retention portion 83 is configured to be received and retained within a corresponding opening 43, 44 in the cover 40, as discussed further below.

The connection terminal PCB connection portion 84 includes the connection terminal second end 82 of the connection terminal 80 including the pair of connector plugs 89 that are received in a contact socket 19 of the PCB 18.

The connection terminal body portion 85 extends between the cover retention portion 83 and the PCB connection portion 84, and includes a flange 92 that protrudes from a lateral side edge 90 of the connection terminal 80. The flange 92 protrudes in a direction perpendicular to the second surface 94 (e.g., a capacitor-facing side of the body portion 85). The body portion 85, excluding the flange 92, is co-planar with the cover retention portion 83 and the PCB connection portion 84, and resides in a plane that is parallel to the sidewall first and second sides 24, 25.

The flange 92 provides an insulation displacement contact (IDC) 88 that is configured to receive, and form an electrical connection with, a capacitor lead 8. In the illustrated embodiment, the IDC 88 is a narrow V-shaped cut out that open upward, e.g., opens facing the carrier cover 40. In use, the body portion 85 is electrically connected to a respective capacitor lead 8 at a connection location 86 corresponding to the joint between the capacitor lead 8 and the IDC 88. Since the capacitor lead 8 forms an electrical connection to the connection terminal 80 via the IDC 88, the capacitor 2 is electrically connected to the PCB 18 via the connection terminal 80. The flange 92, including the connection location 86, is disposed in the encapsulation chamber 50, whereby the electrical connection between the capacitor lead 8 and the connection terminal 80 is encapsulated.

A portion of the body portion 85 that is disposed between the flange 92 and the PCB connection portion 84 is a planar plate that is shaped and dimensioned to be press fit into the connection terminal openings 36, 37 provided in the sidewall 23 at a location adjacent to the capacitor second end 6, whereby the carrier 20 is secured to the respective connection terminals 80.

The support terminals 100 are electrically conductive terminals that are press fit into the support terminal openings 38, 39 provided in the sidewall 23 at a location adjacent to the capacitor first end 5.

The support terminals 100 are similar to the connection terminals 80. For this reason, common elements are referred to with common reference numbers, and the description of the common elements is not repeated. The support terminals 100 are different from the connection terminals 80 in that the support terminals 100 do not include a flange 92 or IDC 88. In addition, the first side edge 90 and the second side edge 91 of the support terminals 300 each include shoulder 95 corresponding to a location at which the body portion 85 widens. The shoulders 95 are disposed between the serrated region 98 and the support terminal second end 82.

In addition, although the support terminal 100 is electrically conductive, and the support terminal plugs 89 are received in the contact socket 19 of the PCB 18, the support terminal 100 is not electrically connected to the capacitor 2. Thus, the support terminal 100 provides a mechanical connection between the carrier 20 and the PCB 18, and does not provide an electrical connection between the capacitor 2 and the PCB 18.

Although the cover 40 is secured to the sidewall 23 by the two connection terminals 80 and the front-most support terminal 100, the cover 40 may also include latches 60. The latches 60 are a supplemental securement feature that ensures that the cover 40 remains secured to the sidewall 23, allowing the capacitor carrier 20 to function reliably (e.g., to retain the capacitor 2 therein and to maintain an electrical connection to the PCB contact sockets 19) regardless of extreme use conditions, for example in applications that include large vibrations or mechanical shocks. The latches 60 are disposed on a side of the carrier 20 that is opposed to the living hinge 34, and are spaced apart from each other.

Each latch 60 comprises a hook portion 62 and a loop portion 63 that engages the hook portion 62, whereby the cover 40 is prevented from pivoting about the living hinge 34. The hook portion 62 protrudes outward from the outer surface of the sidewall first side 24. The hook portion 62 has a rectangular profile when the carrier 20 is viewed facing the sidewall first side 24. The hook portion 62 has an angled outward-facing surface 66. An upper end of the outward facing surface 66 is flush with the sidewall first side 24, and a lower end of the outward facing surface 66 is spaced apart from the sidewall first side 24, whereby the hook portion has a right-triangular profile in cross section. The lower edge 68 of the hook portion 62 is parallel to the first floor member 59a and provides an engagement surface that abuts a surface of the loop portion 63. The loop portion 63 is a rectilinear loop that depends from the front-facing surface of the cover 40 and defines a through opening 64. When the cover 40 closes the open end of the sidewall 23, the loop portion 63 overlies the sidewall first side 24 at a location corresponding to a respective hook portion 62. In addition, when the cover 40 is closed, the hook portion 62 is received within the through opening 64 and an upward-facing edge 65 of the through opening 64 along a lower end of the loop portion 63 engages the lower edge 68 of the hook portion 62, preventing the cover 40 from pivoting about the living hinge 34.

Although the carrier 20 is shown having two latches 60, it is understood that the carrier 20 may include a greater or fewer number of latches as required by the specific application. Moreover, it is contemplated that there are applications in which the latches may be omitted, for example as shown in the second embodiment capacitor carrier described below.

Referring to FIGS. 17-32, an alternative embodiment capacitor carrier assembly 201 includes an alternative embodiment carrier 220, and the capacitor 2 disposed in the carrier 220. In addition, the capacitor carrier assembly 201 includes alternative embodiment connection terminals 280 and support terminals 300. The capacitor carrier assembly 201 shown in FIGS. 17-32 is similar to the capacitor carrier assembly 1 described above with respect to FIGS. 1-16 in that the connection terminals 280 are supported by the carrier 220, and provide an electrical connection between leads 8 of the capacitor 2 and contact sockets 19 of an electronic component or device such as the PCB 18. The support terminals 300 are supported by the carrier 20 and, along with the connection terminals 280, mechanically secure the carrier 220 to the PCB 18. Like the carrier 20, the carrier 220 is a receptacle that receives and retains the capacitor 2 with respect to the PCB 18. In addition, the carrier 220 includes wall structures that enclose the capacitor leads 8 as discussed further below, whereby in the event of whisker formation, contact between the whiskers and the PCB 18, and components thereof, can be avoided.

The carrier 220 includes a first container portion 222(1) that is configured to receive and support a first portion of the capacitor 2, and a second container portion 222(2) that is configured to receive and support a second portion of the capacitor 2. The first container portion 222(1) and the second container portion 222(2) are each half shells having an open side 227, and when assembled together, define an interior space that is configured to receive and retain the capacitor 2.

The first container portion 222(1) and the second container portion 222(2) each have the same shape and dimensions such that the first container portion 222(1) and the second container portion 222(2) are identical. By using two identical parts to provide the carrier 220, manufacturing costs are reduced, and part logistics and assembly is simplified, as compared for example to the earlier-described embodiment. Since the first container portion 222(1) and the second container portion 222(2) have the same shape and dimensions, only the first container portion 222(1) will be described in detail, and will be referred to as the "container portion 222."

The container portion 222 includes wall structures 221 that provide a hemi-cylindrical portion 204 that is shaped and dimensioned to receive and support a portion of the capacitor casing 4, and a rectangular prism portion 206 that is shaped and dimensioned to receive the first capacitor lead and the second capacitor lead.

The wall structures 221 that provide the hemi-cylindrical portion 204 form a hollow structure having a generally hemi-cylindrical shape. In particular, the wall structures 221 that provide the hemi-cylindrical portion 204 define a half of a cylinder, where the cylinder has been halved along its height direction. As a result, the wall structures 221 include a generally planar first side 224, a generally planar second side 225 that is parallel to, and spaced apart from the first side 224, and a third side 226 that extends between the first and second sides 224, 225. The third side 226 is curved so as to partially surround a container portion longitudinal axis 234 that is parallel to the cylinder height direction and perpendicular to the first and second sides 224, 225.

Respective inner surfaces 224a, 225a, 226a of the first side 224, the second side 225 and the third side 226 face the capacitor 2 when a capacitor 2 is disposed in the carrier 220. Respective outer surfaces 225b, 226b of the second side 225 and the third side 226 define portions of the outer surface of the container portion 222. The first side 224 is shared in common with the rectangular prism portion 206, whereby an outer surface 224b of the first side 224 forms a portion of the encapsulation chamber 250, as discussed below.

The first side 224 has a free, or exposed, first edge 261, and the second side 225 has a free, or exposed, second edge 262. The curved third side 226 has a free, or exposed third edge 263 and a free, or exposed, fourth edge 264 that is parallel to and spaced apart from the third edge 263. The respective first, second, third and fourth edges 261, 262, 263, 264 of the hemi-cylindrical portion 204 together form a rectangular profile when the container portion 222 is viewed facing the open side 227. The first edge 261, the third edge 263 and the fourth edge 264 are acutely angled relative to the respective inner and outer surfaces 224a and 224b, 225a and 225b, 226a and 226b of the respective first, second and third sides 224, 225, 226. In addition, the third edge 263 and the fourth edge 264 are parallel to each other.

Figure 26:
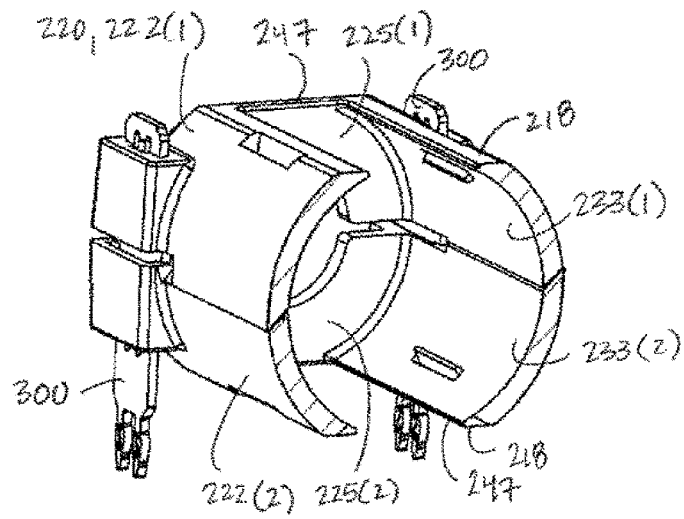
FIG. 26 is a perspective cross-sectional view of the capacitor carrier assembly of FIG. 17 as seen along line 26-26 of FIG. 17, shown with the capacitor omitted.
Figure 27:
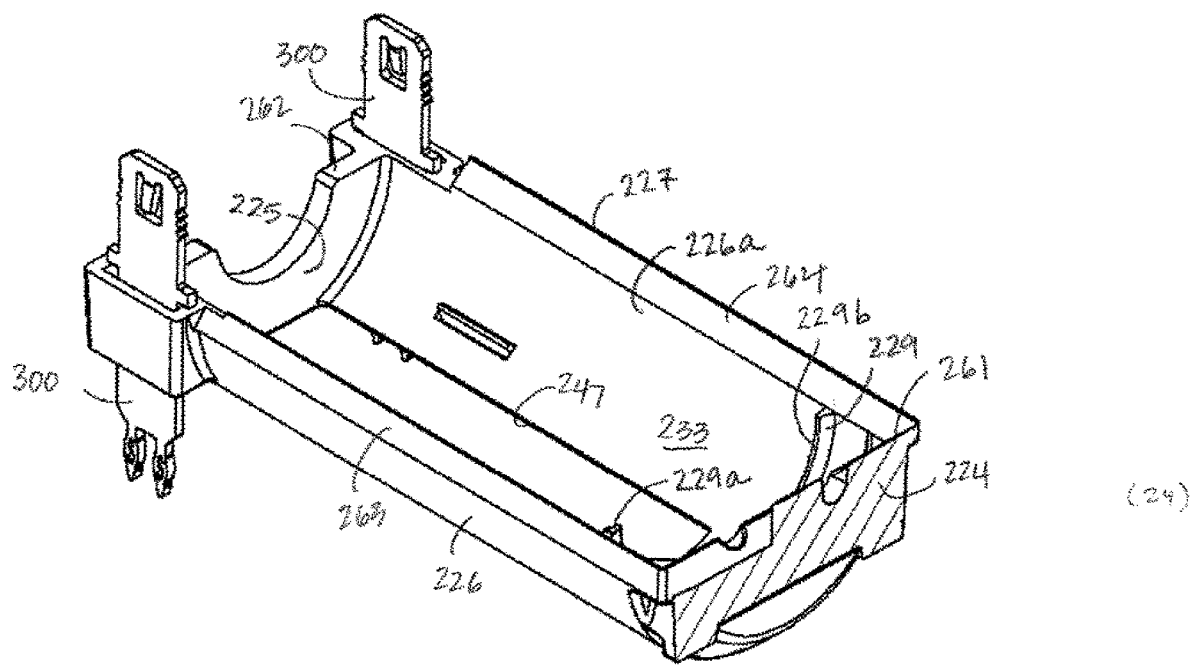
FIG. 27 is a perspective cross-sectional view of the container portion of the capacitor carrier assembly of FIG. 17 as seen along line 27-27 of FIG. 21, shown with the support terminals included.

The inner surface 226a of the curved third side 226 provides a cradle 233 that is configured to support the capacitor 2 within the sidewall. The cradle 233 has a partial circular profile when viewed in cross section (FIG. 26). More specifically, the cradle 233 has a shape that corresponds to the shape and dimensions of a portion of a surface of the capacitor casing 4.

Figure 21:
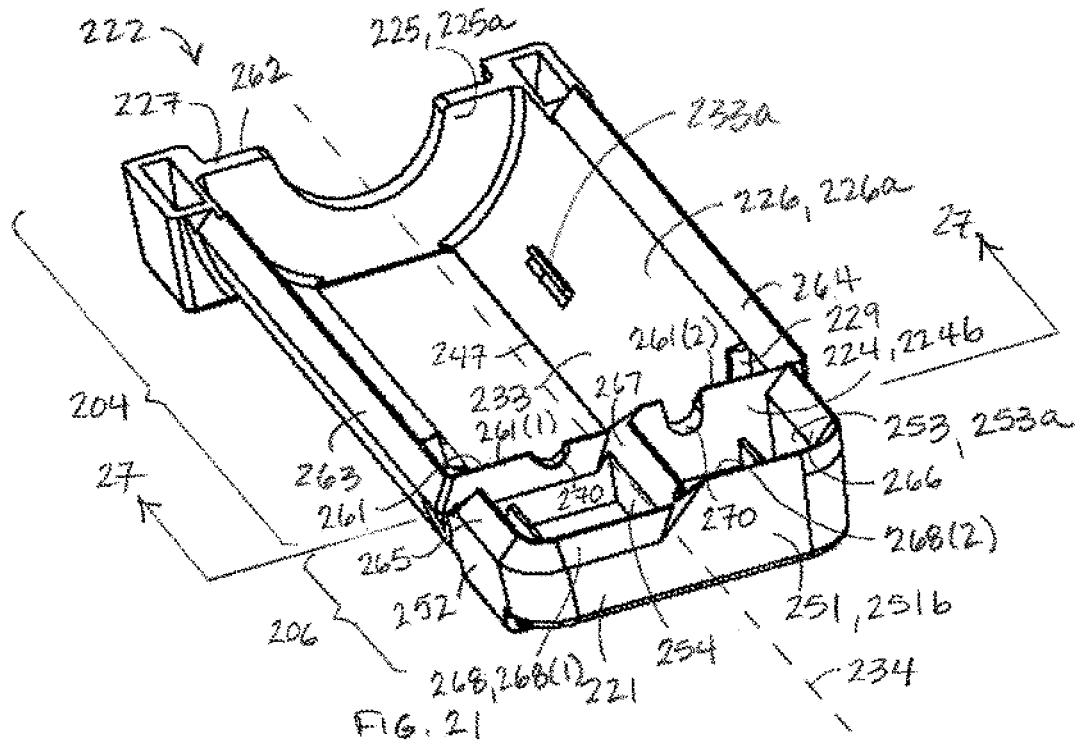
FIG. 21 is a front perspective view of a container portion of the capacitor carrier assembly of FIG. 17.
Figure 22:
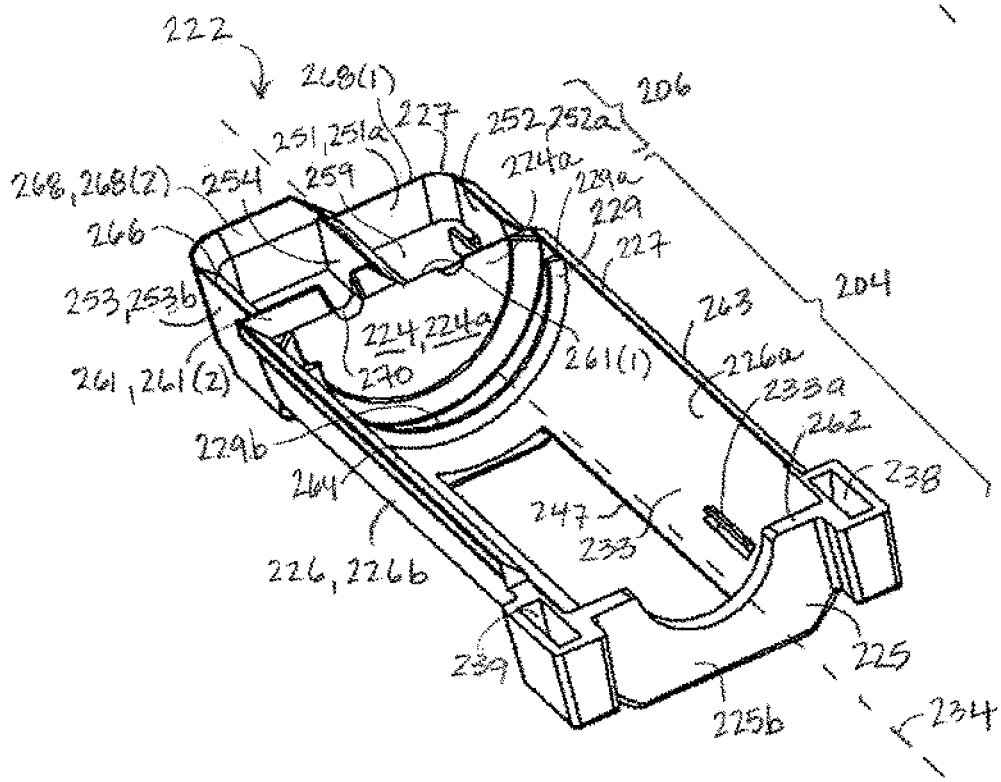
FIG. 22 is a rear perspective view of a container portion of the capacitor carrier assembly of FIG. 17.
Figure 23:
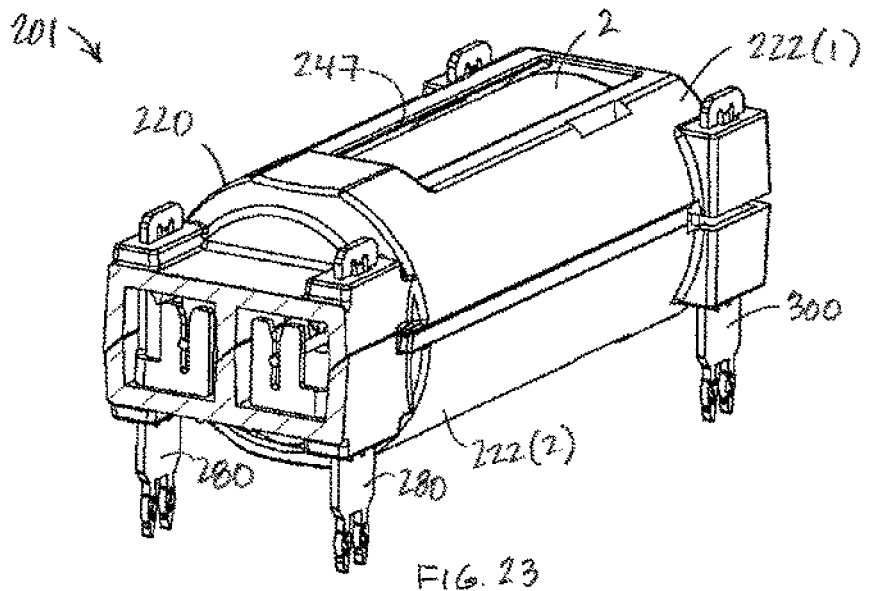
FIG. 23 is a perspective cross-sectional view of the capacitor carrier assembly of FIG. 17 as seen along line 23-23 of FIG. 17.
Figure 24:
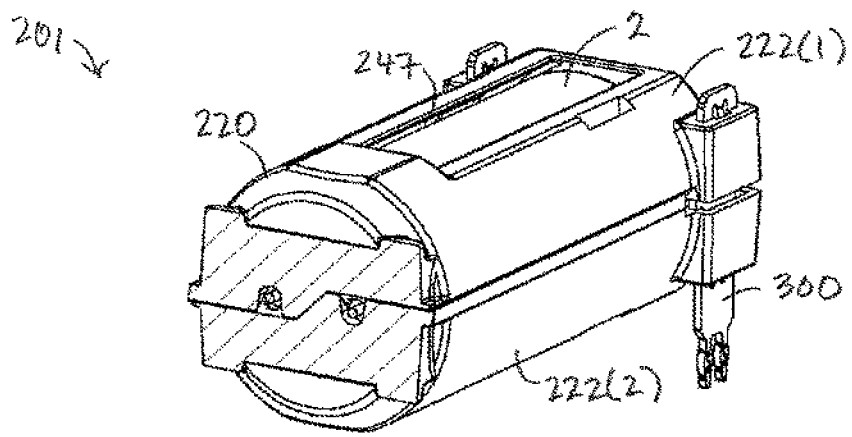
FIG. 24 is a perspective cross-sectional view of the capacitor carrier assembly of FIG. 17 as seen along line 24-24 of FIG. 17.
Figure 25:
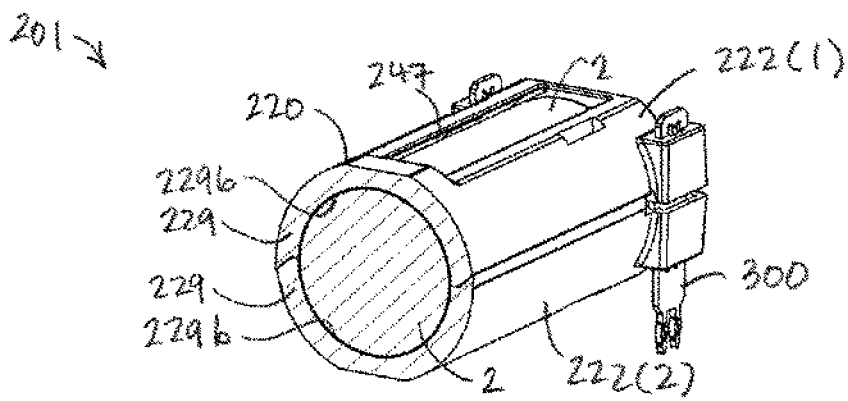
FIG. 25 is a perspective cross-sectional view of the capacitor carrier assembly of FIG. 17 as seen along line 25-25 of FIG. 17.

In some embodiments, the cradle 233 may include deformable capacitor support structures that keep the capacitor 2 from moving around within the carrier during use in conditions of vibration and/or shock. For example, in the illustrated embodiment, the cradle 233 includes two, circumferentially-spaced crush ribs 233a that protrude radially inward from the third side inner surface 226 (FIGS. 21, 22). The crush ribs 233 have a generally triangular profile, and the apex of each crush rib 233a is configured to crush or deform to accommodate capacitors of differing diameters. As an alternative to employing crush ribs 233a, the cradle 233 may include an elastic spring feature (not shown) that protrudes inward from the third side inner surface 226a, and elastically accommodates capacitors of differing diameters.

Figure 18:
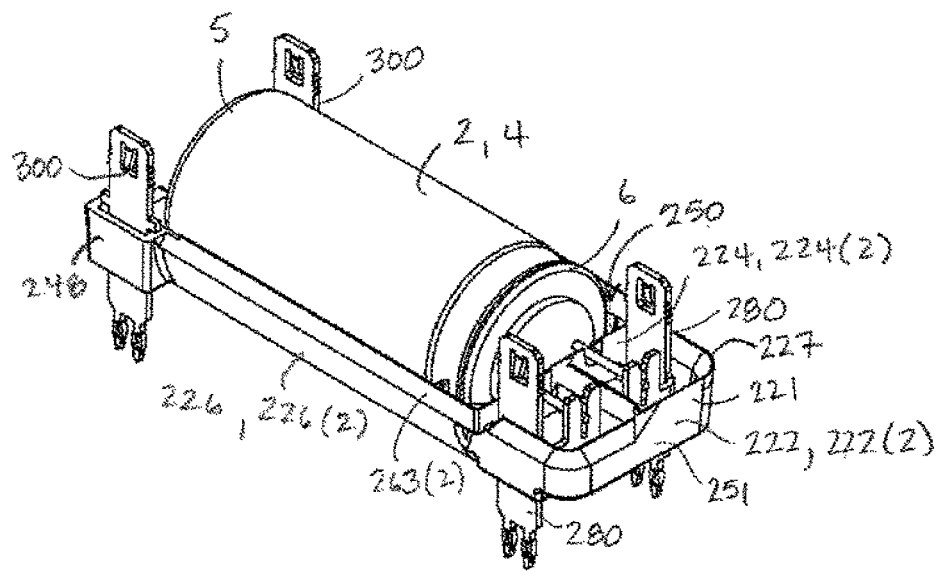
FIG. 18 is a perspective view of the capacitor carrier assembly of FIG. 17, shown with the first container portion omitted.

When the capacitor 2 is disposed in the carrier 220 oriented as shown in FIG. 18, the capacitor 2 rests on the cradle 233 and is partially surrounded by the first, second, third sides 224, 225, 226, and encircled by their respective edges 261, 262, 263, 264.

The outer surface 226b of the third side 226 is truncated to provide a flat 218 that is parallel to the open side 227. The third side 226 also includes a single container opening 247 that is disposed on the flat 218. The container opening 247 advantageously allows a determination of whether a capacitor 2 is disposed in the carrier 220 upon visual inspection.

The wall structures 221 that provide the hemi-cylindrical portion 204 include a separating member 229 that is configured to engage the capacitor casing 4 along the annular region 14, whereby the capacitor 2 is retained in a desired longitudinal position relative to the capacitor carrier 20. In particular, the separating member 229 protrudes from the inner surface 226a of the third side 226 toward the open side 227 in a direction perpendicular to the third side inner surface 226a. The separating member 229 is parallel to the first and second sides 224, 225 and includes a free edge 229a that faces the open side 227. The free edge 229a includes a curved (semi-circular) separating member cut out 229b. The separating member cut 229b out has a shape and dimensions that correspond to the shape and dimensions of a portion of a circumference of the casing 4. In particular, the separating member cut 229b out has a shape and dimensions that correspond to the shape and dimensions of a portion of a circumference of the capacitor annular region 14.

The wall structures 221 that provide the rectangular prism portion 206 include four sidewall portions arranged to form a frame (e.g., a closed rectangular section). In particular, the four sidewall portions include a first transverse portion corresponding to the first side 224 that is shared in common with the hemi-cylindrical portion 204, and a planar second transverse portion 251 that is parallel to the first side 224. The first side 224 and the second transverse portion 251 each extend in a direction transverse to the longitudinal axis 234.

The four sidewall portions include a planar first longitudinal portion 252 that extends between the first side 224 and the second transverse portion 251 in a direction parallel to the longitudinal axis 234 and is slightly inboard relative to the third edge 263. In addition, the four sidewall portions include planar second longitudinal portion 253 that extends between the first side 224 and the second transverse portion 251 in a direction parallel to the longitudinal axis 234 and is slightly inboard relative to the fourth edge 264. The wall structures 221 that provide the rectangular prism portion 206 also include a planar third longitudinal wall portion 254 that extends between the first side 224 and the second transverse portion 251 in a direction parallel to the longitudinal axis 234 and is disposed between the first and second longitudinal portions 252, 253.

The outer surface 224b of the first side 224, the inner surface 251a of the second transverse portion 251 and the respective inner surfaces 252a, 253a of the first and second longitudinal portions 252, 253 face the capacitor leads 8 when a capacitor 2 is disposed in the carrier 220. The third longitudinal portion 254 is disposed between the capacitor leads 8 when a capacitor 2 is disposed in the carrier 220. Respective outer surfaces 252b, 253b, 251b of the first longitudinal portion 252, the second longitudinal portion 253 and the second transverse portion 251 define portions of the outer surface of the container portion 222.

The wall structures 221 that provide the rectangular prism portion 206 include a floor member 259 that closes an end of the frame that is opposed to the open side 227. The floor member 259 is planar and parallel to the open side 227. The periphery of the floor member 259 adjoins each of the first side 224, the second transverse portion 251, the first longitudinal portion 252 and the second longitudinal portion 253.

The first longitudinal portion 252 has a fifth free, or exposed, edge 265, the second longitudinal portion 253 has a sixth free, or exposed, edge 266 and the third longitudinal portion 254 has a seventh free, or exposed, edge 267. The respective first, fifth, sixth and seventh edges 261, 265, 266, 267, of the rectangular prism portion 206 together form a rectangular profile when the container portion 222 is viewed facing the open side 227. Each of the fifth, sixth and seventh edges 265, 266, 267 are acutely angled relative to the inner and outer surfaces 252a and 252b, 253a and 253b, 254a and 254b of the respective first, second and third longitudinal portions 252, 253, 254. In addition, the fifth, sixth and seventh edges 265, 266, 267 are parallel to each other.

The first side 224 (corresponding to the first transverse portion) has the first free, or exposed, edge 261, and the second transverse portion 251 has an eighth free, or exposed, edge 268. In addition, the first side 224 and the second transverse portion 251 each have a discontinuity in a height dimension. As a result, a first portion 261(1), 268(1) of the respective first edge 261 and eighth edge 268 has a first height dimension, and a second portion 261(2), 268(2) of the first edge 261 and the eighth edge 268 has a second height dimension, where a height dimension corresponds to a distance of the respective edge 261, 268 from the floor member 259, and where the first portions 261(1), 268(1) are the portions closest to the third edge 263 and the second portions 261(2), 268(2) are the portions closest to the fourth edge 264. In the illustrated embodiment, the first portions 261(1), 268(1) are shorter than the second portions 261(2), 268(2).

Each of the first portions 261(1), 268(1) of the first and eighth edges 261, 268 and the second portions 261(2), 268(2) of the first and eighth 261, 268 are acutely angled relative to the inner and outer surfaces 224a and 224b, 251a and 251b of the respective first side 224 and second transverse portion 251. The first portion 261(1) of the first edge 261 is parallel to the first portion 268(1) of the eighth edge 268, and the second portion 261(2) of the first edge 261 is parallel to the second portion 268(2) of the eighth edge 268, where the angle of the first portions 261(1), 268(1) is opposite that of the angle of the second portions 261(2), 268(2).

The first portion 261(1) and the second portion 261(2) of the first edge 261 each include a curved cut out 270 that is shaped and dimensioned to receive a capacitor lead 8 in a clearance fit.

The first container portion 222(1) and the second container portion 222(2) are assembled together such that the free edges of the first container portion confront the respective free edges of the second container portion 222(2). In particular, the first edge 261 of the first container portion 222(1) abuts, and is parallel to, the first edge 261 of the second container portion 222(2), the second edge 262 of the first container portion 222(1) faces, and is parallel to, the second edge 262 of the second container portion 222(2), the third edge 263 of the first container portion 222(1) abuts, and is parallel to, the fourth edge 264 of the second container portion 222(2), the fourth edge 264 of the first container portion 222(1) abuts, and is parallel to, the third edge 263 of the second container portion 222(2), the fifth edge 265 of the first container portion 222(1) abuts, and is parallel to, the sixth edge 266 of the second container portion 222(2), the sixth edge 266 of the first container portion 222(1) abuts, and is parallel to, the fifth edge 265 of the second container portion 222(2), the seventh edge 267 of the first container portion 222(1) abuts, and is parallel to, the seventh edge 267 of the second container portion 222(2), and the eighth edge 268 of the first container portion 222(1) abuts, and is parallel to, the eighth edge 268 of the second container portion 222(2). As a result, when the first container portion 222(1) is assembled with the second container portion 222(2) the joined edges 261, 263, 264, 265, 266, 267, 268 are each "shingled" such that the joined edges 261, 263, 264, 265, 266, 267, 268 are overlapping when viewed along (e.g., from points within) a plane 235 that includes the open side 227. Since the joined edges 261, 263, 264, 265, 266, 267, 268 are each shingled, the carrier 220 can expand to accommodate a capacitor 2 of various sizes while still enclosing the capacitors 2.

Referring to FIGS. 17-18, 22 and 32, when the first container portion 222(1) and the second container portion 222(2) are in the assembled configuration, the respective hemi-cylindrical portions 204 of each of the first container portion 222(1) and the second container portion 222(2) cooperate to provide a cylindrical chamber that receives the capacitor casing 4. The separating member 229 of the first container portion 222(1) cooperates with the separating member 229 of the second container portion 222(2) to form an interior wall 232. In addition, the separating member cut out 229b of the first container portion 222(1) and the separating member cut out 229b of the second container portion 222(2) are received within the capacitor annular region 14 and extend along substantially the entire circumference of the capacitor 2 within the annular region 14. By this configuration, the separating members 229 of the respective first and second container portions 222(1), 222(2) cooperate to closely encircle the capacitor 2 within the annular region 14, and the capacitor 2 is retained in a desired longitudinal position relative to the carrier 220.

The proximal and distal ends 10, 12 of the capacitor leads 8, including the connection locations 32 at which the capacitor leads 8 are connected to the connection terminals 280, are encapsulated in a closed interior space referred to hereafter as an encapsulation chamber 250. The encapsulation chamber 250 is defined between the interior wall 232 and the second transverse portion 251, between the first and second longitudinal portions 252, 253, and between the respective floor members 259 of the first and second container portions 222(1), 222(2).

The encapsulation chamber 250 is configured to retain therein any whiskers that may form on the capacitor leads 8, whereby contact between the whiskers and the PCB 18, and components thereof, can be avoided. Moreover, the encapsulation chamber 250 is segregated into three separate encapsulation zones 241, 242, 243, which separate the respective connection locations 86 of the capacitor leads 8 from each other and from the proximal ends 10 of the capacitor leads 8. In particular, the encapsulation chamber 250 includes a first zone 241 that is defined between the interior wall 232, the first side 224, and the corresponding portions of the third sides 226. The first zone 241 encapsulates the proximal end 10 of each capacitor lead 8. The encapsulation chamber 250 includes a second zone 242 that is defined between the first side 224, the second transverse portions 251, the first longitudinal portion 252, the third longitudinal portion 254, and the respective floor members 259 of the first and second container portions 222(1), 222(2). The second zone 242 encapsulates the connection location 86 and distal end 12 of one of the capacitor leads 8. In addition, the encapsulation chamber 250 includes a third zone 243 that is defined between the first side 244, the second transverse portions 251, the first longitudinal portion 252, the third longitudinal portion 254, and the respective floor members 259 of the first and second container portions 222(1), 222(2). The third zone 243 encapsulates the connection location 86 and distal end 12 of the other of the capacitor leads 8.

The first container portion 222(1) and the second container portion 222(2) each include connection terminal openings 236, 237 that are configured to receive and retain the respective connection terminals 280. The first one 236 of the connection terminal openings 236, 237 extends through the floor member 259 at a location adjacent to the first longitudinal portion 252, and a second one 237 of the connection terminal openings 236, 237 extends through the floor member 259 at a location adjacent to the second longitudinal portion 253.

In addition, the first container portion 222(1) and the second container portion 222(2) each include support terminal openings 238, 239 that are configured to receive and retain the respective support terminals 300. The first one 238 of the support terminal openings 238, 239 extends through a first boss 248 disposed on the outer surface 226b of the third side 226. The first boss 248 is located at an intersection of the third free edge 263 with the second side 225. The second one 239 of the support terminal openings 238, 239 extends through a second boss 249 disposed on the outer surface 226b of the third side 226. The second boss 249 is located at an intersection of the fourth free edge 264 with the second side 225.

By this configuration, when the first container portion 222(1) and the second container portion 222(2) are in the assembled configuration, each of the connection terminal openings 236, 237 of the first container portion 222(1) is aligned with a corresponding one of the connection terminal openings 236, 237 of the second container portion 222(2). Similarly, when the first container portion 222(1) and the second container portion 222(2) are in the assembled configuration, each of the support terminal openings 238, 239 of the first container portion 222(1) is aligned with a corresponding one of the support terminal openings 238, 239 of the second container portion 222(2).

In addition to the first container portion 222(1) and the second container portion 222(2) of the carrier 220, the capacitor carrier assembly 201 includes the connection terminals 280 and support terminals 300.

Referring to FIGS. 28 and 29, the connection terminals 280 are press fit into the connection terminal openings 236, 237. Each connection terminal 280 is an electrically conductive thin plate that includes a first end 281, a second end 282 that is opposed to the first end 281, and a midpoint 278 disposed mid way between the first end 281 and the second end 282. Each connection terminal 280 includes a first side edge 290 that extends between the first end 281 and the second end 282, and a second side edge 291 that is parallel to the first side edge 290 and extends between the first end 281 and the second end 282. The connection terminal 280 is elongated such that the distance between the first side edge 290 and the second side edge 291 is less than the distance between the first end 281 and the second end 282. Each connection terminal 280 includes a first surface 293, and a second surface 294 that is opposed to the first surface 293. The first and second surfaces 293, 294 are bounded by the first end 281, the second end 282, the first side edge 290 and the second side edge 291.

The connection terminal second end 282 includes a plug 289 that is configured to be press fit into an electrically conductive socket. In the illustrated embodiment, the connection terminal second end 282 includes a pair of plugs 289 that are disposed side-by-side, and are configured to be received in the contact socket 19 of the PCB 18. In use, the plugs 289 provide an electrical and mechanical connection between the connection terminal 280 and the PCB 18.

The first and second side edges 290, 291 of each connection terminal 280 include first and second serrated regions 298, 299. In particular, the first serrated region 298 is disposed on each of the first and second side edges 290, 291 at a location disposed between the first end 281 and the midpoint 278. In addition, the second serrated region 299 is disposed on each of the first and second side edges 290, 291 at a location disposed between the midpoint 278 and the second end 282. Each serrated region 298, 299 includes a series of closely-spaced protruding ridges 274, where each ridge 274 terminates in an apex 276.

Each connection terminal 280 includes a first and second elastic member 272, 273 that protrudes from the first surface 293. In particular, the first elastic member 272 protrudes from the first surface 293 at a location disposed between the first end 281 and the midpoint 278, so as to be flanked by the serrations of the first serrated region 298. In addition, the second elastic member 273 protrudes from the first surface 293 at a location disposed between the midpoint 278 and the second end 282, so as to be flanked by the serrations of the second serrated region 299. Thus, each elastic member 272, 273 is spaced apart from the first end 281, the second end 282, the first side edge 290 and the second side edge 291. In the illustrated embodiment, the first and second elastic members 272, 273 are generally rectangular leaf springs that are formed integrally with the connection terminal 280, for example by a process that includes cutting a partial outline of the elastic members 272, 273 in a punch step, followed by a deforming step whereby a distal tip 272a, 273a of the each of the elastic members 272, 273 is bent so as to protrude from the first surface 293.

Each connection terminal 280 includes a cover retention portion 283, a PCB connection portion 284, and a body portion 285 disposed between the cover retention portion 283 and the PCB connection portion 284.

The connection terminal cover retention portion 283 includes the connection terminal first end 281 and the first serrated region 298. The cover retention portion 283 is configured to be received and retained within a corresponding connection terminal openings 236, 237 of the first container portion 222(1).

The connection terminal PCB connection portion 284 includes the connection terminal second end 282 of the connection terminal 280 including the pair of connector plugs 289 that are received in a contact socket 19 of the PCB 18.

The connection terminal body portion 285 extends between the cover retention portion 283 and the PCB connection portion 284, and includes the second serrated region and a flange 292. The flange 292 protrudes from the first side edge 290 of the connection terminal 280. The flange 292 is disposed between the first and second serrated regions 298, 299, and protrudes in a direction perpendicular to the second surface 294 of the connection terminal 280. That is, the flange 292 protrudes from a capacitor-facing side of the connection terminal 280. In use, the flange 292 is parallel to the capacitor second end 6.

The flange 292 provides an insulation displacement contact (IDC) 88 that is configured to receive, and form an electrical connection with, a capacitor lead 8. In the illustrated embodiment, the IDC 88 is a narrow V-shaped cut out that open upward, e.g., opens facing the container portion open side 227. In use, the connection terminal 280 is electrically connected to a respective capacitor lead 8 at a connection location 86 corresponding to the joint between the capacitor lead 8 and the IDC 88. Since the capacitor lead 8 forms an electrical connection to the connection terminal 280 via the IDC 88, the capacitor 2 is electrically connected to the PCB 18 via the connection terminal 280. The flange 292, including the connection location 86, is disposed in the encapsulation chamber 250, whereby the electrical connection between the capacitor lead 8 and the connection terminal 280 is encapsulated.

Figure 17:
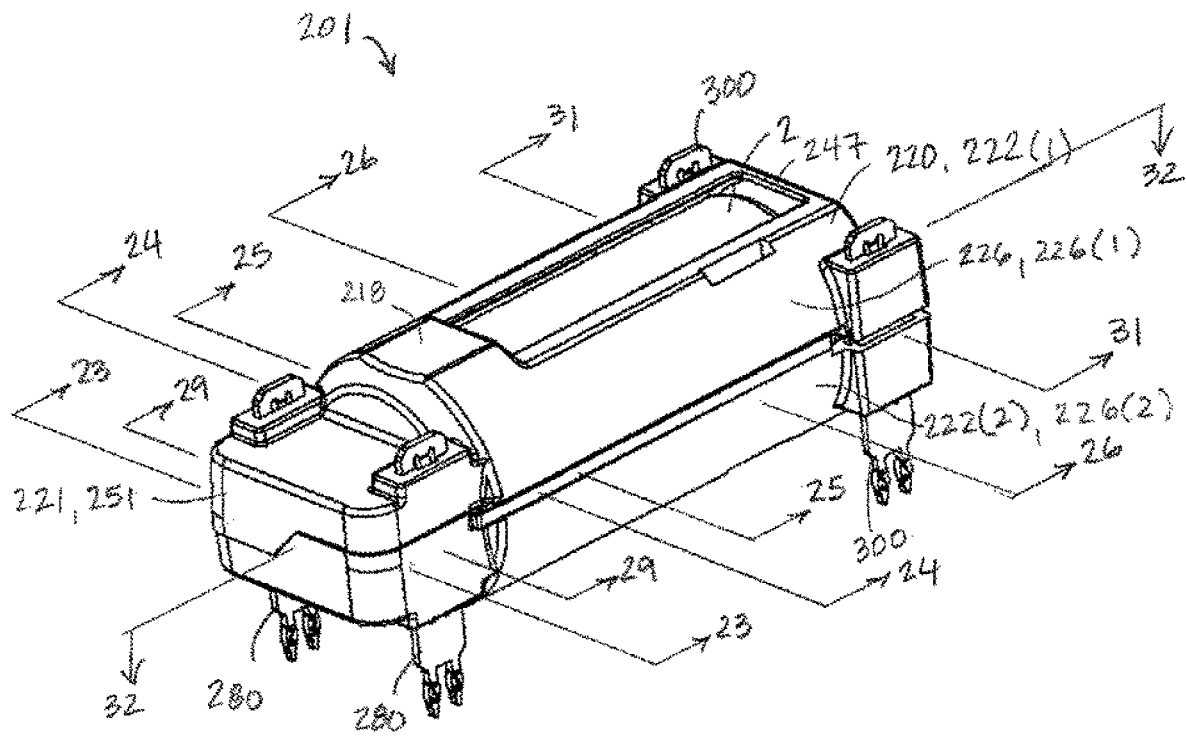
FIG. 17 is a front perspective view of an alternative embodiment capacitor carrier assembly shown with a capacitor disposed in the carrier.

In use, the first container portion 222(1) is assembled with the second container portion 222(2) as shown in FIG. 17, and a connection terminal 280 is press fit into each of the connection terminal openings 236, 237 of the first container portion 222(1) such that the first serrated regions 298 engage with an inner surface of the connection terminal openings 236, 237 of the first container portion 222(1). In addition, the connection terminals 280 are press fit into the connection terminal openings 236, 237 of the second container portion 222(2) such that the first and second surfaces 293, 294 are parallel to the longitudinal axis 234, and such that the second serrated regions 299 engage with an inner surface of the connection terminal openings 236, 237 of the second container portion 222(2).

Still further, the distal tip 272a, 273a of each elastic member 272, 273 engages a shoulder 236a, 237a provided on an inner surface of each of the connection terminal openings 236, 237 (FIG. 29). The shoulders 236a, 237a are parallel to the open side 227, and face away from the open side 227. By this configuration, the first elastic member 272 and the second elastic member 273 cooperate to prevent separation of the first container portion 222(1) from the second container portion 222(2) in a direction perpendicular to the open side 227.

Referring to FIGS. 30 and 31, the support terminals 300 are similar to the connection terminals 280. For this reason, common elements are referred to with common reference numbers, and the description of the common elements is not repeated. The support terminals 300 are different from the connection terminals 280 in that the support terminals 300 do not include a flange 292 or IDC 88. Instead, the first side edge 290 and the second side edge 291 of the support terminals 300 each include a low profile, rectangular protrusion 392. The protrusions 392 are disposed between the first and second serrated regions 298, 299, and protrude in a direction parallel to the second surface 294 of the support terminal 300. The protrusions 392 serve as a stop that prevents over-insertion of the support terminals 300 into the respective support terminal openings 238, 239 of the second container portion 222(2).

In addition, although the support terminal 300 is electrically conductive, and the support terminal plugs 289 are received in the contact socket 19 of the PCB 18, the support terminal 300 is not electrically connected to the capacitor 2. Thus, the support terminal 300 provides a mechanical connection between the carrier 220 and the PCB 18, and does not provide an electrical connection between the capacitor 2 and the PCB 18.

In use, the first container portion 222(1) is assembled with the second container portion 222(2) as shown in FIG. 17, and a support terminal 300 is press fit into each of the support terminal openings 238, 239 of the first container portion 222(1) such that the first serrated regions 298 engage with an inner surface of the support terminal openings 238, 239 of the first container portion 222(1). In addition, the support terminal 300 are press fit into the support terminal openings 238, 239 of the second container portion 222(2) such that the first and second surfaces 293, 294 are parallel to the longitudinal axis 234, and such that the second serrated regions 299 engage with an inner surface of the support terminal openings 238, 239 of the second container portion 222(2).

Still further, the distal tip 272a, 273a of each elastic member 272, 273 engages a shoulder 236a, 237a provided on an inner surface of each of the support terminal openings 238, 239 (FIG. 31). The shoulders 236a, 237a are parallel to the open side 227, and face away from the open side 227. By this configuration, the first elastic member 272 and the second elastic member 273 cooperate to prevent separation of the first container portion 222(1) from the second container portion 222(2) in a direction perpendicular to the open side 227.

Thus, the carrier assembly 1 includes two features that retain the first container portion 222(1) in the assembled configuration with the second container portion 222(2): First, the connection and support terminals 280, 300 each mechanically engage both the first container portion 222(1) and the second container portion 222(2) via the first and second serrated regions 298, 299; and second, the connection and support terminals 280, 300 each mechanically engage both the first container portion 222(1) and the second container portion 222(2) via the elastic members 272, 273.

In the illustrated embodiments, the capacitor carrier assembly mechanically supports a capacitor 2 relative to the PCB 18, and provides an electrical connection between the capacitor 2 and the PCB 18. It is understood that the capacitor carrier assembly can support the capacitor 2 relative to other electronic component or devices, and is not limited to be used with a PCB.

Selective illustrative embodiments of the capacitor carrier assembly are described above in some detail. It should be understood that only structures considered necessary for clarifying the capacitor carrier assembly have been described herein. Other conventional structures, and those of ancillary and auxiliary components of the capacitor carrier assembly, are assumed to be known and understood by those skilled in the art. Moreover, while a working example of the capacitor carrier assembly has been described above, the capacitor carrier assembly is not limited to the working example described above, but various design alterations may be carried out without departing from the capacitor carrier assembly as set forth in the claims.

We claim:

1. A capacitor carrier, the carrier configured to support a capacitor that includes a casing, a first capacitor lead and a second capacitor lead, the first and second capacitor leads protruding from one end of the casing,
the carrier comprising:
an electrically conductive first connection terminal supported by the carrier, the first connection terminal including
a first body portion that is configured to be electrically connected to the first capacitor lead at a first connection location,
and
a first device connection portion that protrudes from the carrier; and
an electrically conductive second connection terminal supported by the carrier, the second connection terminal including
a second body portion that is configured to be electrically connected to the second capacitor lead at a second connection location, and
a second device connection portion that protrudes from the carrier;
wall structures that are configured to provide an encapsulation chamber that, when the capacitor is disposed in the carrier, encapsulates at least a portion of each of the first capacitor lead and the second capacitor lead, wherein
when the capacitor is disposed in the carrier, the first connection location and the second connection location are disposed in the encapsulation chamber.

2. The capacitor carrier of claim 1, wherein
the wall structures are configured to provide an encapsulation chamber that encapsulates the one end of the casing of the capacitor.

3. The capacitor carrier of claim 2, wherein the carrier is configured to support the capacitor in such a way that at least a portion of the casing is disposed outside the encapsulation chamber.

4. The capacitor carrier of claim 1, wherein
the encapsulation chamber includes a first zone, and a second zone that is segregated from the first zone by at least one of the wall structures,
the first connection location is disposed in the first zone, and
the second connection location is disposed in the second zone.

5. The capacitor carrier of claim 4, wherein
the encapsulation chamber includes a third zone that is segregated from the first zone and the second zone by at least one of the wall structures,
the third zone is configured to encapsulate a portion of the capacitor that includes the location at which each of the respective first and second capacitor leads exits the capacitor casing.

6. The capacitor carrier of claim 1, wherein the wall structures comprise a first portion and a second portion,
the first portion of the wall structures of the carrier are arranged to provide a first container portion,
the second portion of the wall structures of the carrier are arranged to provide a second container portion, and
the second container portion is configured to be assembled with the first carrier portion in such a way that the capacitor can be disposed between the first container portion and the second container portion.

7. The capacitor carrier of claim 6, wherein
each of the first container portion and the second container portion include a hemi-cylindrical portion that is configured to receive and support at least a portion of the casing, and a rectangular prism portion that is configured to receive at least a portion of the first capacitor lead and the second capacitor lead.

8. The capacitor carrier of claim 7, wherein the hemi-cylindrical portion of each of the first container portion and the second container portion includes:
a first side;
a second side that is parallel to, and spaced apart from the first side;
a third side that extends between the first side and the second side, the third side including a curved portion configured to partially surround a longitudinal axis that is perpendicular to the first side and the second side.

9. The capacitor carrier of claim 8, wherein
the hemi-cylindrical portion of each of the first container portion and the second container portion includes a separating member that protrudes from an inner surface of the third side,
the separating member includes a separating member cut out that has a curved shape and dimensions that correspond to a shape and dimensions of a portion the casing,
the separating member cut out is configured to face the portion of the casing,
the separating member of the first container portion cooperates with the separating member of the second container portion to form an interior wall that is parallel to the first and second sides, and the interior wall is one of the wall structures that encapsulate the capacitor leads.

10. The capacitor carrier of claim 7 wherein the rectangular prism portion includes:

a first longitudinal wall portion;

a second longitudinal wall portion that is parallel to the first longitudinal wall portion;

a first transverse wall portion that is perpendicular to, and extends between, the first longitudinal wall portion and the second longitudinal wall portion;

a second transverse wall portion that is parallel to the first transverse wall portion, and extends between the first longitudinal wall portion and the second longitudinal wall portion;

a third longitudinal wall portion that is parallel to the first longitudinal wall portion, and extends between the first transverse wall portion and the second transverse wall portion, the third longitudinal wall portion being disposed between the first longitudinal wall portion and the second longitudinal wall portion; and a floor portion, and wherein, the first longitudinal wall portion, the second longitudinal wall portion, the first transverse wall portion and the second transverse wall portion are arranged to form a closed rectangular section, the floor portion closes one end of the closed rectangular section, the rectangular prism portion of the first container portion cooperates with the rectangular prism portion of the second container portion to provide a first encapsulation zone which encapsulates a portion of the first capacitor lead, and a second encapsulation zone which encapsulates a portion of the second capacitor lead, where the second capsulation zone is separated from the first encapsulation zone by the third longitudinal wall portion.

11. A capacitor carrier assembly including:

a capacitor carrier that is shaped and dimensioned to receive only a single capacitor;

a capacitor disposed in the carrier, the capacitor including a casing, a first capacitor lead and a second capacitor lead, the first and second capacitor leads protruding from one end of the casing;

wherein the first capacitor lead and the second capacitor lead are encapsulated by wall structures of the carrier.

12. The capacitor carrier assembly of claim 11, wherein the carrier comprises:

an electrically conductive first connection terminal supported by the carrier, the first connection terminal including a first body portion that is electrically connected to the first capacitor lead at a first connection location, and a first device connection portion that protrudes from the carrier; and an electrically conductive second connection terminal supported by the carrier, the second connection terminal including a second body portion that is electrically connected to the second capacitor lead at a second connection location, and a second device connection portion that protrudes from the carrier, the wall structures are configured to provide an encapsulation chamber that encapsulates at least a portion of the capacitor, and the first connection location and the second connection location are disposed in the encapsulation chamber.

13. The capacitor carrier assembly of claim 12, wherein the capacitor is received in the carrier in such a way that at least a portion of the casing is disposed outside the encapsulation chamber.

14. The capacitor carrier assembly of claim 12, wherein the encapsulation chamber includes a first zone, and a second zone that is segregated from the first zone by at least one of the wall structures, the first connection location is disposed in the first zone, and the second connection location is disposed in the second zone.

15. The capacitor carrier assembly of claim 14, wherein the encapsulation chamber includes a third zone that is segregated from the first zone and the second zone by at least one of the wall structures, the location at which each of the respective first and second capacitor leads exits the capacitor is disposed in the third zone.

16. The capacitor carrier assembly of claim 11, wherein the wall structures include a first portion and a second portion, the first portion of the wall structures of the carrier are arranged to provide a first container portion, the second portion of the wall structures of the carrier are arranged to provide a second container portion, and the second container portion is configured to be assembled with the first carrier portion in such a way that the capacitor is disposed between the first container portion and the second container portion.

17. The capacitor carrier assembly of claim 16, wherein each of the first container portion and the second container portion include a hemi-cylindrical portion that is configured to receive and support at least a portion of the casing, and a rectangular prism portion that is configured to receive at least a portion of the first capacitor lead and the second capacitor lead.

18. The capacitor carrier assembly of claim 17, wherein the hemi-cylindrical portion of each of the first container portion and the second container portion includes:

a first side;

a second side that is parallel to, and spaced apart from the first side;

a third side that extends between the first side and the second side, the third side including a curved portion configured to partially surround a longitudinal axis that is perpendicular to the first side and the second side.

19. The capacitor carrier assembly of claim 18, wherein the hemi-cylindrical portion of each of the first container portion and the second container portion includes a separating member that protrudes from an inner surface of the third side, the separating member includes a separating member cut out that has a curved shape and dimensions that correspond to a shape and dimensions of a portion the casing, the separating member cut out faces the portion of the casing, the separating member of the first container portion cooperates with the separating member of the second container portion to form an interior wall that is parallel to the first and second sides, and the interior wall is one of the wall structures that encapsulate the capacitor leads.

20. The carrier for a capacitor of claim 17, wherein the rectangular prism portion includes:
   a first longitudinal wall portion;
   a second longitudinal wall portion that is parallel to the first longitudinal wall portion;
   a first transverse wall portion that is perpendicular to, and extends between, the first longitudinal wall portion and the second longitudinal wall portion;
   a second transverse wall portion that is parallel to the first transverse wall portion, and extends between the first longitudinal wall portion and the second longitudinal wall portion;
   a third longitudinal wall portion that is parallel to the first longitudinal wall portion, and extends between the first transverse wall portion and the second transverse wall portion, the third longitudinal wall portion being disposed between the first longitudinal wall portion and the second longitudinal wall portion; and
   a floor portion,
   the first longitudinal wall portion, the second longitudinal wall portion, the first transverse wall portion and the second transverse wall portion are arranged to form a closed rectangular section,
   the floor portion closes one end of the closed rectangular section,
   the rectangular prism portion of the first container portion cooperates with the rectangular prism portion of the second container portion to provide a first encapsulation zone which encapsulates a portion of the first capacitor lead, and a second encapsulation zone which encapsulates a portion of the second capacitor lead, where the second capsulation zone is separated from the first encapsulation zone by the third longitudinal wall portion.

* * * * *